US011812545B2

(12) United States Patent
Hong et al.

(10) Patent No.: US 11,812,545 B2
(45) Date of Patent: Nov. 7, 2023

(54) POWER SUPPLY SYSTEM AND ELECTRONIC DEVICE

(71) Applicant: Delta Electronics (Shanghai) CO., LTD, Shanghai (CN)

(72) Inventors: Shouyu Hong, Shanghai (CN); Qingdong Chen, Shanghai (CN); Sansan Guo, Shanghai (CN); Wulong Cong, Shanghai (CN); Yiqing Ye, Shanghai (CN); Chongfeng Zheng, Shanghai (CN); Ganyu Zhou, Shanghai (CN); Pengkai Ji, Shanghai (CN)

(73) Assignee: Delta Electronics (Shanghai) CO., LTD, Shanghai (CN)

( * ) Notice: Subject to any disclaimer, the term of this patent is extended or adjusted under 35 U.S.C. 154(b) by 0 days.

(21) Appl. No.: 17/656,432

(22) Filed: Mar. 25, 2022

(65) Prior Publication Data

US 2022/0217836 A1 Jul. 7, 2022

Related U.S. Application Data

(63) Continuation-in-part of application No. 17/108,040, filed on Dec. 1, 2020, now Pat. No. 11,320,879.

(30) Foreign Application Priority Data

Jan. 8, 2020 (CN) .......................... 202010016898.7
Oct. 18, 2021 (CN) .......................... 202111210246.8
Dec. 28, 2021 (CN) .......................... 202111626437.2

(51) Int. Cl.
*G06F 1/26* (2006.01)
*H05K 1/14* (2006.01)
*H05K 1/02* (2006.01)

(52) U.S. Cl.
CPC ............. *H05K 1/0231* (2013.01); *G06F 1/26* (2013.01); *H05K 1/141* (2013.01); *H05K 1/144* (2013.01); *H05K 2201/10212* (2013.01)

(58) Field of Classification Search
CPC ............. G06F 1/26; G06F 1/32; G06F 1/3203; H05K 1/0231; H05K 1/11; H05K 1/14;
(Continued)

(56) References Cited

U.S. PATENT DOCUMENTS 5,798,567 A * 8/1998 Kelly ................ H01L 23/49816
257/E23.079
10,395,819 B2 8/2019 Wukovits et al.
(Continued)

FOREIGN PATENT DOCUMENTS

CA 2647863 A1 7/2009
CN 101211792 A 7/2008
(Continued)

OTHER PUBLICATIONS

The 1st office action dated Jan. 24, 2022 for CN patent application No. 202010018822.8.
(Continued)

*Primary Examiner* — Levi Gannon
(74) *Attorney, Agent, or Firm* — Qinghong Xu

(57) ABSTRACT

The present disclosure provides a power supply system and an electronic device. The power supply system is used to supply power to a load and includes a system board where the load is disposed; a substrate; at least one output capacitor surface-mounted on the second side of the system board; at least one positive output conductive-connected region disposed on the first side of the substrate, and being electrically connected to one terminal of the at least one output capacitor; at least one negative output conductive-connected region disposed on the first side of the substrate, and being
(Continued)

electrically connected to other terminal of the at least one output capacitor; and at least one power unit disposed on the second side of the substrate, and being electrically connected to the at least one positive output conductive-connected region and the at least one negative output conductive-connected region.

28 Claims, 25 Drawing Sheets

(58) Field of Classification Search
CPC ........ H05K 1/141; H05K 1/144; H05K 1/181; H05K 7/00; H05K 7/02; H05K 7/023; H05K 7/10; H05K 2201/10212
See application file for complete search history.

(56) References Cited

U.S. PATENT DOCUMENTS

| | | | |
|---|---|---|---|
| 2004/0027813 A1* | 2/2004 | Li | H05K 1/0231 257/E23.079 |
| 2005/0274982 A1 | 12/2005 | Ueda et al. | |
| 2006/0181857 A1 | 8/2006 | Belady et al. | |
| 2007/0045815 A1* | 3/2007 | Urashima | H01L 23/5383 257/E23.079 |
| 2009/0290316 A1* | 11/2009 | Kariya | H01L 23/50 361/767 |
| 2009/0296360 A1 | 12/2009 | Doblar et al. | |
| 2010/0258952 A1 | 10/2010 | Fjelstad | |
| 2011/0080717 A1* | 4/2011 | Koide | H01L 23/49827 361/803 |
| 2014/0133115 A1 | 5/2014 | Iguchi | |
| 2016/0300659 A1 | 10/2016 | Zhang et al. | |
| 2016/0379952 A1 | 12/2016 | Cahill et al. | |
| 2017/0048963 A1 | 2/2017 | Murakami | |
| 2017/0069607 A1 | 3/2017 | Yap | |
| 2018/0032117 A1 | 2/2018 | Leigh et al. | |
| 2018/0076718 A1 | 3/2018 | Zeng et al. | |
| 2019/0074771 A1 | 3/2019 | Zeng et al. | |
| 2019/0254166 A1 | 8/2019 | Ji et al. | |
| 2019/0320554 A1 | 10/2019 | Nakajima et al. | |
| 2020/0211977 A1 | 7/2020 | Kim et al. | |
| 2020/0260586 A1 | 8/2020 | Hong et al. | |
| 2021/0280354 A1 | 9/2021 | Xiong et al. | |

FOREIGN PATENT DOCUMENTS

| | | | |
|---|---|---|---|
| CN | 103730434 A | 4/2014 | |
| CN | 103871716 A | 6/2014 | |
| CN | 104112727 A | 10/2014 | |
| CN | 105449987 A | 3/2016 | |
| CN | 102648667 B | 9/2016 | |
| CN | 106329930 A | 1/2017 | |
| CN | 107154385 A | 9/2017 | |
| CN | 206726916 U | 12/2017 | |
| CN | 107545974 A | 1/2018 | |
| CN | 108962556 A | 12/2018 | |
| CN | 111313655 A | 6/2020 | |
| CN | 212086589 U | 12/2020 | |
| CN | 112788842 A | 5/2021 | |
| IN | 201914054517 A | 12/2019 | |
| IN | 202014000536 A | 1/2020 | |
| JP | H097862 A | 1/1997 | |
| JP | 2019079943 A | 5/2019 | |

OTHER PUBLICATIONS

The 1st Office Action dated Dec. 31, 2021 for CN patent application No. 202010018831.7.
The 1st Office Action dated Dec. 16, 2021 for IN patent application No. 202014054043.
The 1st Office Action dated Sep. 23, 2021 for IN patent application No. 202034053622.
The Non-Final OA dated May 10, 2021 for U.S. Appl. No. 17/108,040.
Non-Final Rejection dated Jul. 11, 2022 of U.S. Appl. No. 17/102,393.
1st Office Action dated Aug. 29, 2023 of Chinese Application No. 202010016898.7.

* cited by examiner

POWER SUPPLY SYSTEM AND ELECTRONIC DEVICE

CROSS-REFERENCE TO RELATED APPLICATIONS

This application is a continuation-in-part application of U.S. application Ser. No. 17/108,040 filed on Dec. 1, 2020 and entitled "POWER SUPPLY MODULE AND ELECTRONIC DEVICE", which is based upon and claims priority to Chinese Patent Application No. 202010016898.7, filed on Jan. 8, 2020, and further claims priority to Chinese Patent Application No. 202111210246.8, filed on Oct. 18, 2021 and Chinese Patent Application No. 202111626437.2, filed on Dec. 28, 2021, the entire content of which are herein incorporated by reference for all purpose.

TECHNICAL FIELD

The present invention relates to the technical field of power electronics, in particular to a power supply system and an electronic device.

BACKGROUND

The core of data processing lies in various types of processor chips, such as a central processing unit (CPU), a graphics processing unit (GPU), a field programmable gate array (FPGA) and a mass customization processor (ASIC). Power supply system is very important for the performance of the processor chip, and a stable power supply voltage can effectively improve the performance of the processor chip. Therefore, the supplied power is also very important for the steady-state and dynamic performances of the power unit of the processor chip. In the power supply system, the connection impedance between the power unit and the processor chip is relatively large, which directly affects the power supply performance of the power unit to the processor chip, resulting in poor performance of the processor chip, and in turn leading to poor power supply performance of the overall power supply system.

Therefore, it is necessary to develop a power supply system to solve the problems in the prior art.

SUMMARY

According to an aspect of the present disclosure, a power supply system is provided. The power supply system is used to supply power to a load and includes a system board, a substrate, at least one output capacitor, at least one positive output conductive-connected region, at least one negative output conductive-connected region and at least one power unit. The system board includes a first side and a second side disposed opposite to each other, wherein the load is disposed on the first side. The substrate includes a first side and a second side disposed opposite to each other, the first side of the substrate is located between the second side of the system board and the second side of the substrate. The at least one output capacitor is surface-mounted on the second side of the system board. The at least one positive output conductive-connected region is disposed on the first side of the substrate, is connected to the second side of the system board, and is electrically connected to one terminal of the at least one output capacitor via a wiring in the system board. The at least one negative output conductive-connected region is disposed on the first side of the substrate, is connected to the second side of the system board, and is electrically connected to other terminal of the at least one output capacitor via the wiring in the system board. The at least one power unit is disposed on the second side of the substrate, and is electrically connected to the at least one positive output conductive-connected region and the at least one negative output conductive-connected region via a wiring in the substrate.

According to another aspect of the present disclosure, an electronic device is provided. The electronic device includes a load and the aforementioned power supply system, and the power supply system is used to supply power to the load.

Figure 1:
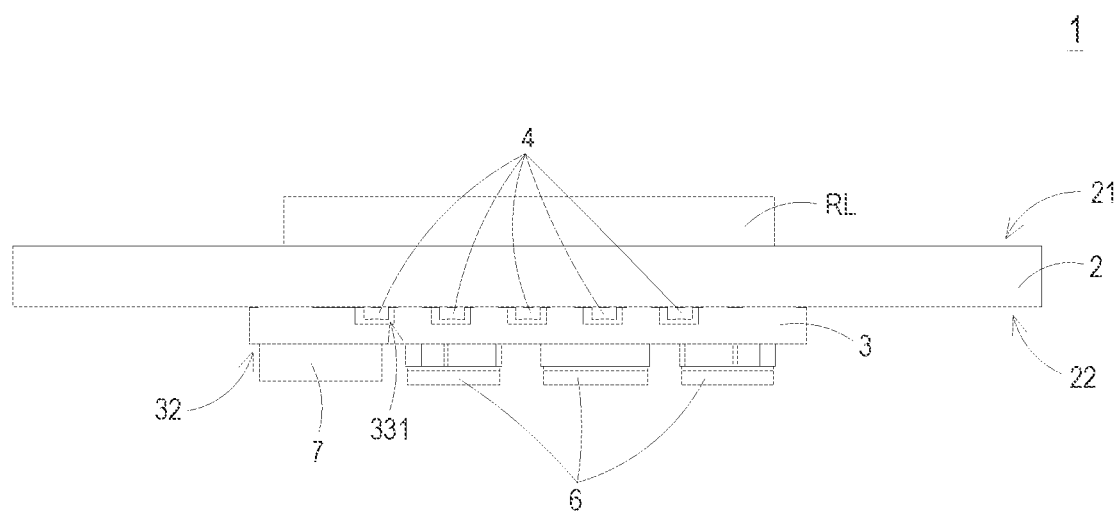
FIG. 1 is a schematic cross-sectional structure diagram of a power supply system according to a first embodiment of the disclosure.

REFERENCE NUMERALS 1, 1a, 1b, 1c: Power Supply System
Vin: Input Voltage
RL: Load
Cin: Input Capacitor
Q1, Q2: Switching Element
L: Inductor
Co: Output Capacitor
Vin+: Positive Input Terminal
Vin−: Negative Input Terminal
Vout+: Positive Output Terminal
Vout−: Negative Output Terminal
2: System Board
21: First Side of System Board
22: Second Side of System Board
3, 3a, 3': Substrate
31: First Side of Substrate
32: Second Side of Substrate
331: First Accommodating Groove
331a: Second Accommodating Groove
331b: Third Accommodating Groove
331c: Fourth Accommodating Groove
332: Connection Hole
333: Copper Pillar
334: Conductive Structure
34: First Sidewall of Substrate
35: Second Sidewall of Substrate
36: Third Sidewall of Substrate
37: Fourth Sidewall of Substrate
381: Controller Pad
382: Capacitor Pad
39, 39a: Power Unit Pad
391: Signal Terminal
392: Input Terminal
393: Output Terminal
394: Ground Terminal
395: First Sidewall of Power unit Pad
396: Second Sidewall of Power unit Pad
397: Third Sidewall of Power unit Pad
398: Fourth Sidewall of Power unit Pad
O: Center Point
4: Output Capacitor
51: Positive Output Conductive-connected region
511: Sub-Positive Output Conductive-connected region
52: Negative Output Conductive-connected region
521: Sub-Negative Output Conductive-connected region
53: Positive Input Conductive-connected region
531: Sub-Positive Input Conductive-connected region
54: Negative Input Conductive-connected region
541: Sub-Negative Input Conductive-connected region
6: Power unit
601: Positive Output Terminal of Power Unit
602: Negative Output Terminal of Power Unit
61: First Arrangement Row
62: Second Arrangement Row
63: Third Arrangement Row
64: Fourth Arrangement Row
7: Controller

DETAILED DESCRIPTION

Some typical embodiments that embody the features and advantages of the present disclosure will be described in detail in the following description. It should be understood that the present disclosure has various changes in different embodiments without departing from the scope of the present disclosure, and the descriptions and drawings therein are for illustrative purposes only, rather than for limiting the present disclosure.

Figure 2:
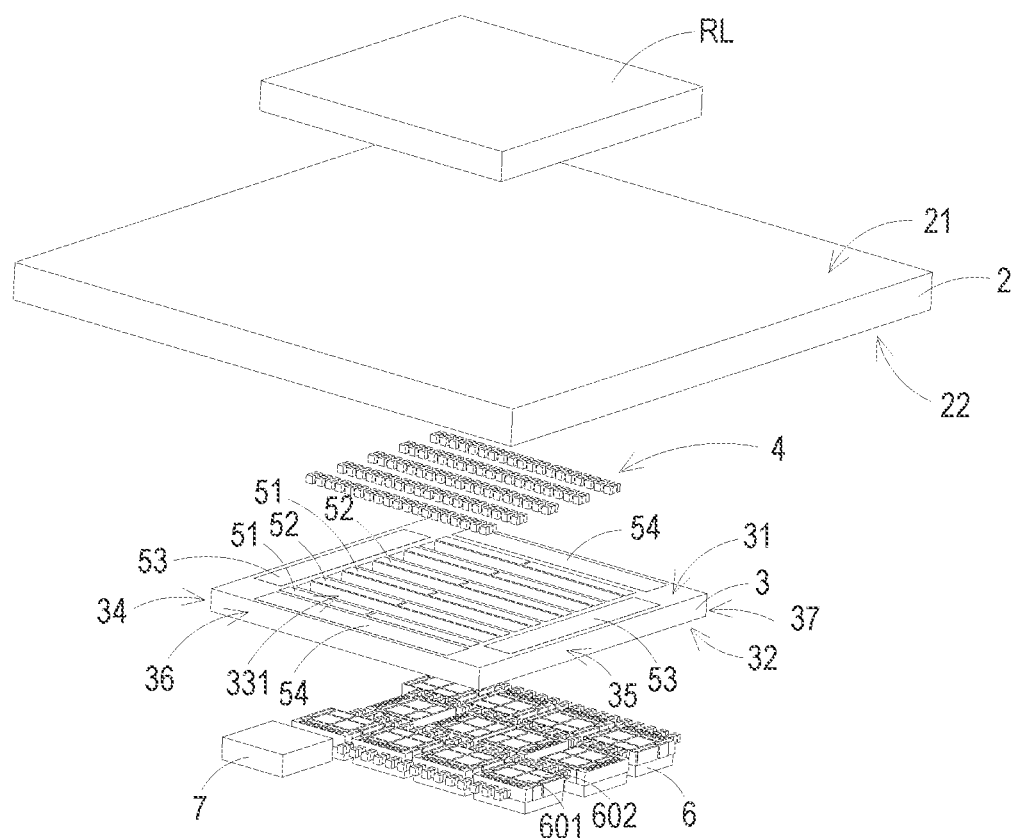
FIG. 2 is a schematic diagram of an exploded structure of the power supply system shown in FIG. 1.
Figure 3A:
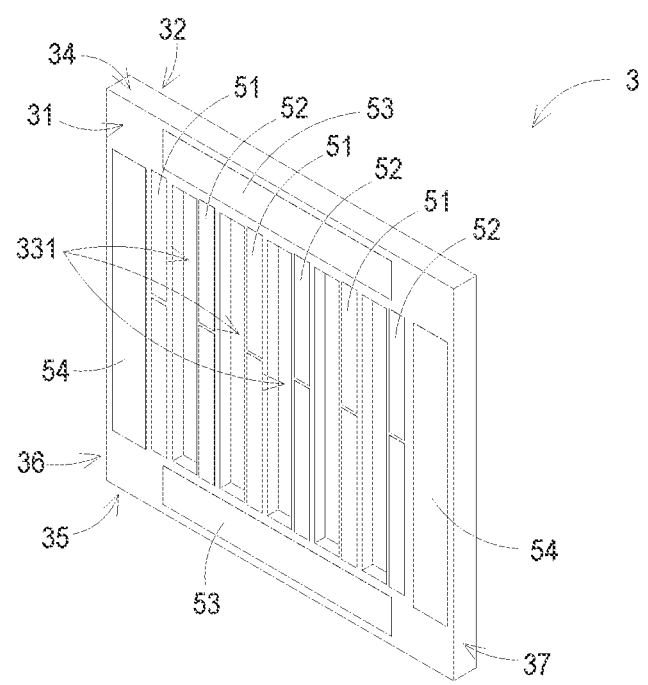
FIGS. 3A and 3B are schematic structural diagrams of a substrate of the power supply system shown in FIG. 1 from two different viewing angles.
Figure 3B:
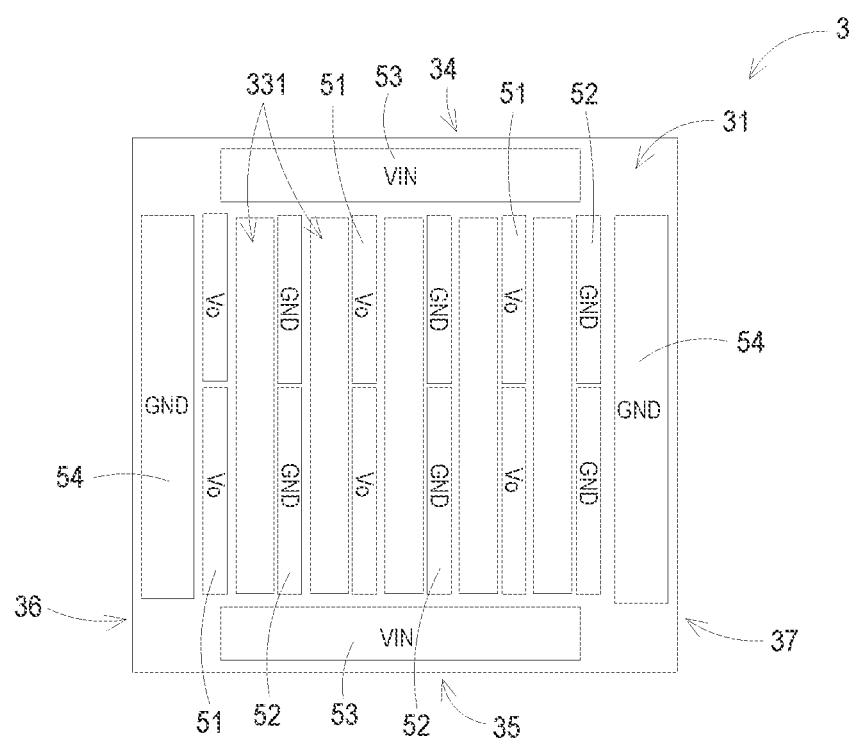
Figure 3C:
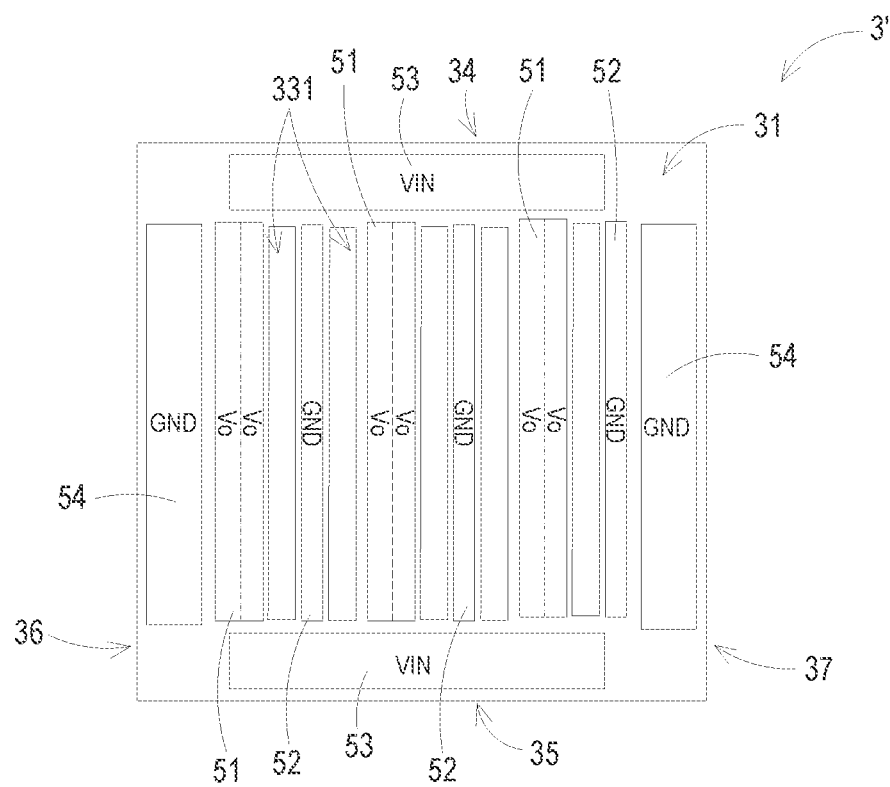
FIG. 3C is a schematic structural diagram of another embodiment of the substrate of the power supply system shown in FIG. 1.
Figure 3D:
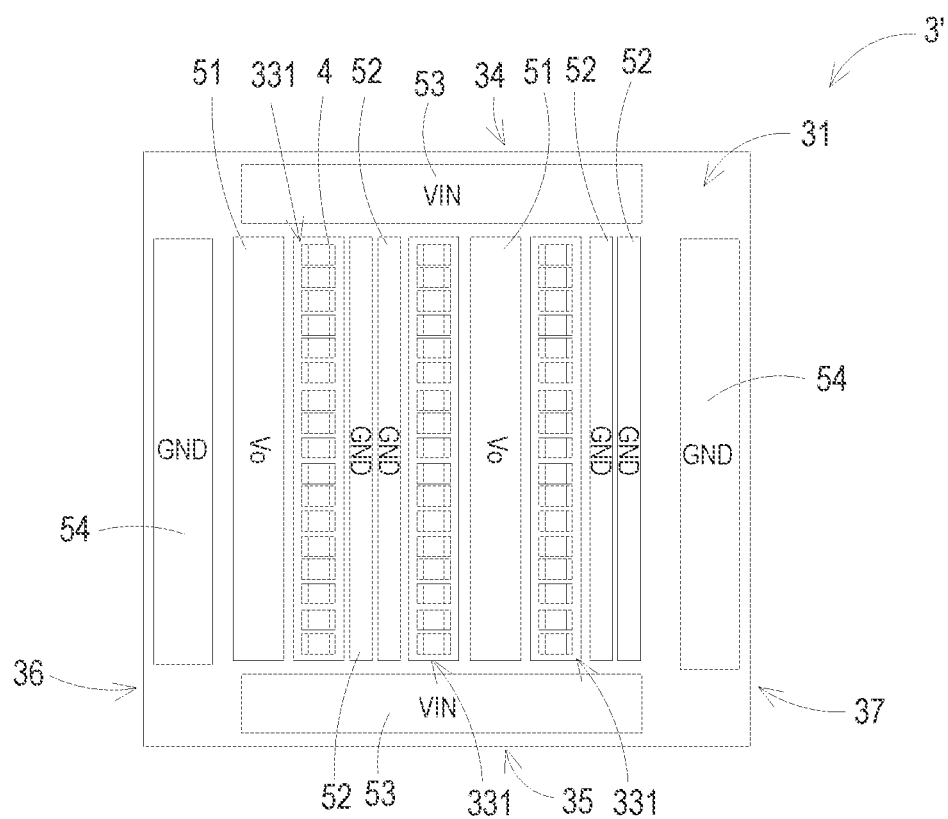
FIG. 3D is a schematic structural diagram of another embodiment of the substrate of the power supply system shown in FIG. 1.
Figure 3E:
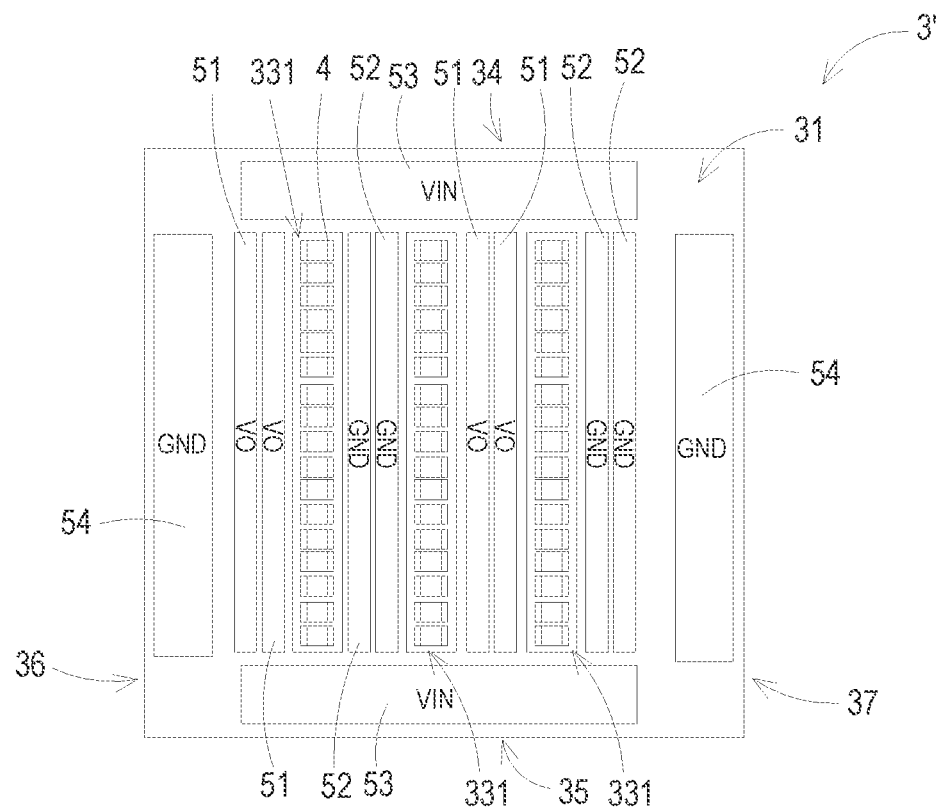
FIG. 3E is a schematic structural diagram of another embodiment of the substrate of the power supply system shown in FIG. 1.
Figure 3F:
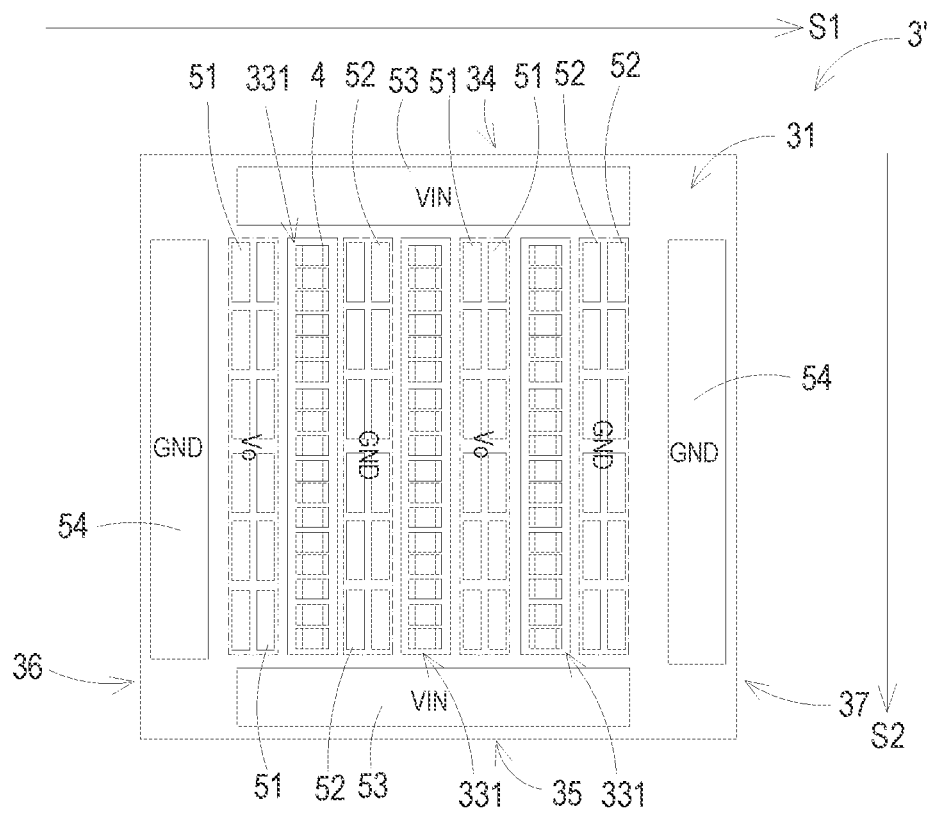
FIG. 3F is a schematic structural diagram of another embodiment of the substrate of the power supply system shown in FIG. 1.
Figure 3G:
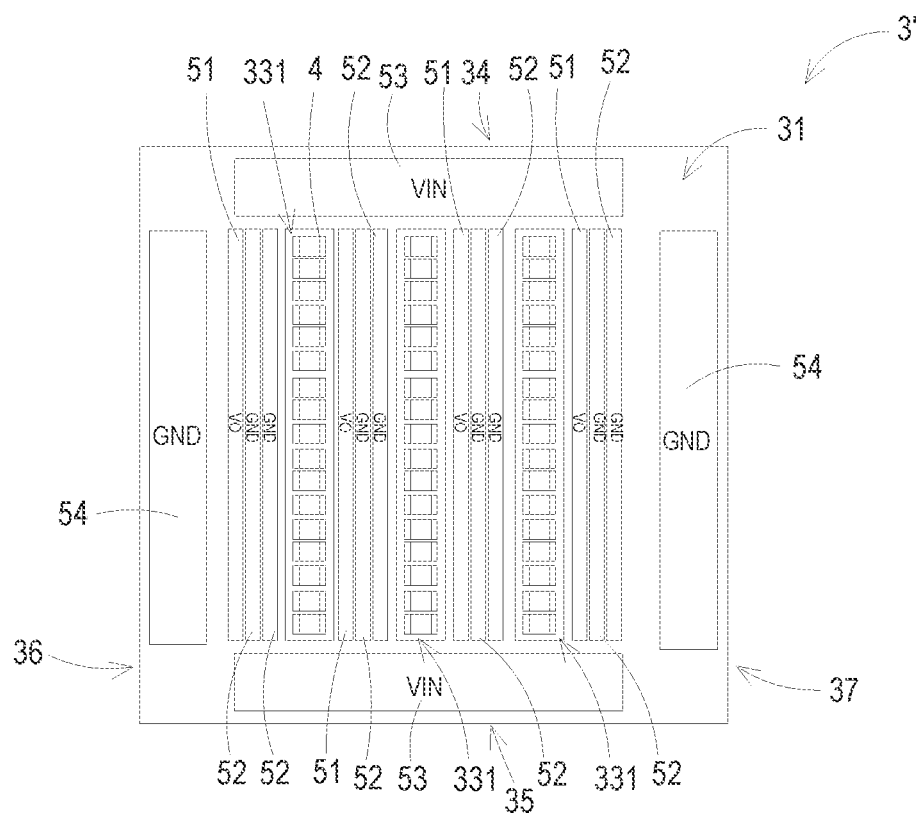
FIG. 3G is a schematic structural diagram of another embodiment of the substrate of the power supply system shown in FIG. 1.
Figure 4:
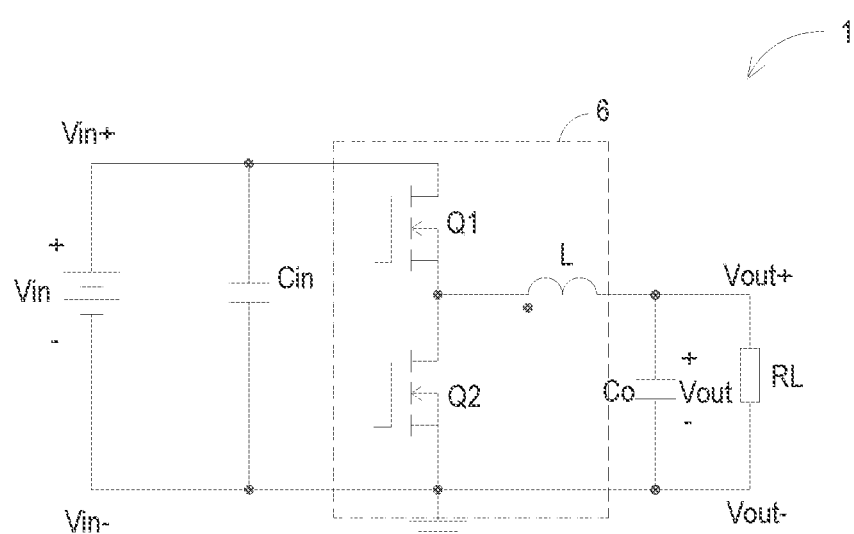
FIG. 4 is an equivalent circuit diagram of the power supply system shown in FIG. 1.

Referring to FIGS. 1 to 4, FIG. 1 is a schematic cross-sectional structure diagram of a power supply system according to a first embodiment of the disclosure; FIG. 2 is a schematic diagram of an exploded structure of the power supply system shown in FIG. 1; FIGS. 3A and 3B are schematic structural diagrams of a substrate of the power supply system shown in FIG. 1 from two different viewing angles; and FIG. 4 is an equivalent circuit diagram of the power supply system shown in FIG. 1, wherein FIG. 4 only schematically shows a power supply circuit of a single-phase power unit, and the power unit in the actual power supply system may include a parallel structure of a plurality of circuits shown in the dashed box of FIG. 4 to output the power required by a load RL. Of course, two or more phases of circuit in the dashed box corresponding to one power unit can be connected in parallel and there is no limitation here. The power supply system 1 of this embodiment is configured to receive and convert the input voltage Vin, so as to supply power to the load RL, wherein the load RL is a processor chip, such as a Central Processing Unit (CPU), a Graphics Processing Unit (GPU), a Tensor Processing Unit (TPU), a Network Processing Unit (NPU), a Field Programmable Gate Array (FPGA), or an Application Specific Integrated Circuit (ASIC). The power supply system 1 shown in FIG. 1 may include one or more power units, and may form a plurality of circuit structures shown in FIG. 4, wherein the output terminals of the multiple power units are connected in parallel to supply power to the load RL together. The power supply system 1 composed of a single single-phase power unit is described below. As shown in FIG. 4, the power supply system 1 includes an input capacitor Cin, two switching elements Q1, Q2, an inductor L and an output capacitor Co, wherein two switching elements Q1, Q2 and the inductor L constitute the power unit 6 of the power supply system 1 to convert electric energy provided by the input voltage Vin. The power unit 6 of the power supply system 1 may be a BUCK circuit or an LLC circuit. The input capacitor Cin is connected to the input voltage Vin to receive electric energy provided by the input voltage Vin, and two terminals of the input capacitor Cin are respectively connected to a positive input terminal Vin+ and a negative input terminal Vin− of the power supply system 1. The two switching elements Q1 and Q2 are connected in series with each other, and a circuit branch formed by the series connected two switching elements Q1 and Q2 is connected in parallel with the input capacitor Cin. A first terminal of the inductor L is connected to a midpoint of the two switching elements Q1 and Q2, and a second terminal of the inductor L is connected to the output capacitor Co. Two terminals of the output capacitor Co are respectively connected to a positive output terminal Vout+ and a negative output terminal Vout− of the power supply system 1, and the output capacitor Co is connected in parallel with the load RL. The negative input terminal Vin− and the negative output terminal Vout− of the power supply system 1 are shorted connection.

As shown in FIGS. 1 to 3B, the physical structure of the power supply system 1 of this embodiment includes a system board 2, a substrate 3, a plurality of output capacitors 4, a plurality of positive output conductive-connected regions 51, a plurality of negative output conductive-connected regions 52, a plurality of positive input conductive-connected regions 53, a plurality of negative input conductive-connected regions 54 and a plurality of power units 6. First, as shown in FIG. 1 and FIG. 2, the system board 2 includes a first side 21 and a second side 22. The first side 21 and the second side 22 of the system board 2 are disposed opposite to each other, and the load RL is disposed on the first side 21 of the system board 2. As shown in FIG. 2, FIG. 3A and FIG. 3B, the substrate 3 includes a first side 31, a second side 32, a plurality of first accommodating grooves 331, a first sidewall 34, a second sidewall 35, and a third sidewall 36 and the fourth sidewall 37. The first side 31 and the second side 32 of the substrate 3 are disposed opposite to each other, and the first side 31 of the substrate 3 is surface-mounted to the second side 22 of the system board 2, so that the first side 31 of the substrate 3 is located between the second side 22 of the system board 2 and the second side 32 of the substrate 3, wherein a setting position that the substrate 3 is located on the system board 2 corresponds to a setting position that the load RL is located on the system board 2. The load RL, the system board 2 and the substrate 3 are overlapped vertically. The plurality of first accommodating grooves 331 are formed by concaving first side 31 of the substrate 3. When the first side 31 of the substrate 3 is surface-mounted to the second side 21 of the system board 2, each of the first accommodating grooves 331 and the second side 22 of the system board 2 respectively define an accommodating space in a closed state, wherein each of the first accommodating grooves 331 can be, but is not limited to, machined by a groove milling process. The first sidewall 34, the second sidewall 35, the third sidewall 36 and the fourth sidewall 37 of the substrate 3 are all located between the first side 31 and the second side 32 of the substrate 3, wherein the first sidewall 34 and the second sidewall 35 are disposed opposite to each other, and the third sidewall 36 and the fourth sidewall 37 are disposed opposite to each other and located between the first sidewall 34 and the second sidewall 35.

As shown in FIG. 1, each of output capacitors 4 is used to form the output capacitor Co in the corresponding power supply system 1 as shown in FIG. 4, and the output capacitor 4 is surface-mounted on the second side 22 of the system board 2 by a welding process, and is electrically connected to the load RL via the wiring in the system board 2. Each of output capacitors 4 is accommodated in the corresponding first accommodating groove 331 on the substrate 3, and the volume of each of the first accommodating grooves 331 is larger than the volume of the corresponding output capacitor 4, and there is a gap between a wall surface of each of the first accommodating grooves 331 and the corresponding output capacitor 4, so that the output capacitor 4 does not contact the wall surface of the corresponding first accommodating groove 331, so as to improve the stability of the output capacitor 4 mounted on the system board 2.

Each of positive output conductive-connected region 51 is used to form the positive output terminal Vout+ in the power supply system 1 shown in FIG. 4 and is arranged on the first side 31 of substrate 3 in sequence. When the first side 31 of substrate 3 is surface-mounted to the second side 22 of system board 2, each of positive output conductive-connected regions 51 is connected to the second side 22 of system board 2. An extension direction of each of positive output conductive-connected regions 51 is the same as the direction of the first sidewall 34 of the substrate 3 pointing to the second sidewall 35, and each of positive output conductive-connected regions 51 is electrically connected to one terminal of the corresponding output capacitor 4 via the wiring in the system board 2, wherein the plurality of positive output conductive-connected regions 51 are connected to each other via the wiring in the substrate 3 to form the positive output terminal Vout+ of the entire power supply system 1. Each of negative output conductive-connected regions 52 is used to form the negative output terminal Vout− in the power supply system 1 shown in FIG. 4 and is arranged on the first side 31 of substrate 3 in sequence. When the first side 31 of substrate 3 is surface-mounted to the second side 22 of system board 2, each of negative output conductive-connected regions 52 is connected to the second side 22 of system board 2. An extension direction of each of negative output conductive-connected regions 52 is the same as the direction of the first sidewall 34 of the substrate 3 pointing to the second sidewall 35, and each of negative output conductive-connected regions 52 is electrically connected to the other terminal of the corresponding output capacitor 4 via the wiring in the system board 2, wherein the plurality of negative output conductive-connected regions 52 are connected to each other via the wiring in the substrate 3 to form the negative output terminal Vout− of the entire power supply system 1. As shown in FIG. 3A and FIG. 3B, the plurality of negative output conductive-connected regions 52 and the plurality of positive output conductive-connected regions 51 are interleaved with each other, which means that there is a corresponding positive output conductive-connected region 51 between every two adjacent negative output conductive-connected regions 52 and there is a corresponding negative output conductive-connected region 52 between every two adjacent positive output conductive-connected regions 51. In this embodiment, each of the first accommodating grooves 331 is located between a corresponding positive output conductive-connected region 51 and a corresponding negative output conductive-connected region 52, so that the output capacitor 4 located in the corresponding first accommodating groove 331 is located between the corresponding positive output conductive-connected region 51 and the corresponding negative output conductive-connected region 52.

In the above-mentioned embodiment, as shown in FIG. 2, the power unit 6 includes at least one positive output terminal 601 and at least one negative output terminal 602. The positive output terminal 601 of the power unit 6 is electrically connected to the corresponding positive output conductive-connected regions 51 via the wiring in the substrate 3, and is electrically connected to one terminal of the output capacitor Co via the wiring in the system board 2. The negative output terminal 602 of the power unit 6 is electrically connected to the corresponding negative output conductive-connected region 52 via the wiring in the substrate 3, and is electrically connected to the other terminal of the output capacitor Co via the wiring in the system board 2.

FIG. 3C shows another possible terminal arrangement form. As shown in FIG. 3C, since the current of the positive output conductive-connected region 51 is larger than that of the negative output conductive-connected region 52, the size of the positive output conductive-connected region 51 will be set wider or set as two parallel positive output conductive-connected regions 51 adjacent to each other, to successively form an arrangement form of a positive output conductive-connected region 51, a positive output conductive-connected region 51, a negative output conductive-connected region 52, a positive output conductive-connected region 51, and a positive output conductive-connected region 51, a negative output conductive-connected region 52, a positive output conductive-connected region 51, a positive output conductive-connected region 51 and a negative output conductive-connected region 52 in sequence, that is, there are two corresponding positive output conductive-connected regions 51 between every two adjacent negative output conductive-connected regions 52. The parallel positive output conductive-connected region 51 (i.e., two corresponding positive output conductive-connected regions 51) can be formed by blocking with a green oil stick on a very wide positive output conductive-connected region 51, as shown by the dotted line in FIG. 3C. It can also be formed by two independent positive output conductive-connected regions 51, and this kind of arrangement is beneficial to the exhaust gas during the welding process between the substrate and the system board and reducing the void ratio.

In addition to the arrangement form shown in FIG. 3C, the arrangement form of the terminals can also has other arrangements. As shown in FIG. 3D, there are two corresponding negative output conductive-connected regions 52 between every two adjacent positive output conductive-connected regions 51. That is, successively forming an arrangement form of a positive output conductive-connected region 51, a negative output conductive-connected region 52, a negative output conductive-connected region 52, a positive output conductive-connected region 51, a negative output conductive-connected region 52 and a negative output conductive-connected region 52 in sequence. In other embodiments, there is a corresponding negative output conductive-connected region 52 between two adjacent positive output conductive-connected regions 51, and the number of negative output conductive-connected regions 52 may be greater than two. As shown in FIG. 3E, two positive output conductive-connected regions 51 or two negative output conductive-connected regions 52 are included between every two adjacent first accommodating grooves 331, that is successively forming an arrangement form of a positive output conductive-connected region 51, a positive output conductive-connected region 51, a negative output conductive-connected region 52, a negative output conductive-connected region 52, a positive output conductive-connected region 51, a positive output conductive-connected region 51, a negative output conductive-connected region 52, and a negative output conductive-connected region 52 in sequence. As shown in FIG. 3F, a plurality of positive output conductive-connected regions 51 or a plurality of negative output conductive-connected regions 52 are included between every two adjacent first accommodating grooves 331. After dividing a large pad into small pads, the exhaust passage of the welding process can be increased, making the welding more stable and reducing the void rate. It should be noted that, in these embodiments, the numbers of the positive output conductive-connected regions 51 and the negative output conductive-connected regions 52 at each place may be other values, such as more than two.

The second side 22 of the system board 2 is used for connecting to the substrate 3, and its pads can be set as a structure that is completely consistent with the pads of the substrate 3. The first side 21 of the system board 2 is used for connecting with the load RL, and its pads can be set as a structure that is completely consistent with the pads of the load RL. Alternatively, in order to satisfy better uniform current flow between the power unit and the load, the second side 22 of the system board 2 can also be set to the same pad layout as the first side 21 of the system board 2, that is, the pad layouts of the first side 21 of the system board 2, the second side 22 of the system board 2, and the first side 31 of the substrate 3 are exactly the same. According to the actual processing process, the relative position between the substrate 3 and the system board 2 may be offset, and the effective welding area must be at least 50% larger than the pad area to ensure welding reliability and current flowing requirements.

Referring to FIGS. 3D to 3F, it can be seen that the polarities of the output conductive-connected regions adjacent to both sides of each output capacitor 4 are different. Two output conductive-connected regions are included between every two adjacent output capacitor 4 along a first direction S1, and the polarities of the two output conductive-connected regions are the same. As shown in FIG. 3G, along the first direction S1, three output conductive-connected regions may also be included between every two adjacent output capacitors 4, wherein the polarities of the output conductive-connected regions adjacent to the two adjacent output capacitors are different. As shown in FIG. 3F, along a second direction S2, the polarities of the same side of adjacent output capacitors 4 are the same. In this embodiment, by setting a plurality of output conductive-connected regions, the current flow capacity is greatly improved, and the power supply efficiency of the power module 6 is further improved. Taking a first column of capacitors on the far left of FIG. 3F as an example, each capacitor includes two end faces, and the same side of the output capacitor 4 refers to a side corresponding to the same end faces of the array of the output capacitors 4 along the second direction, such as, a left side or a right side of output capacitors 4 in FIG. 3F. It should be noted that, in this embodiment, the first direction S1 is an arrangement direction of the first accommodating grooves 331, such as the horizontal direction, and the second direction S2 is an extending direction of the first accommodating grooves 331, such as the longitudinal direction. The second direction S2 is perpendicular to the first direction S1.

Each of the positive input conductive-connected regions 53 is used to form the positive input terminal Vin+ in the power supply system 1 shown in FIG. 4. As shown in FIGS. 2, 3A and 3B, the number of the positive input conductive-connected regions 53 is two, and the two positive input conductive-connected regions 53 are disposed on the first side 31 of the substrate 3 and are respectively adjacent to a first sidewall 34 and a second sidewall 35 of the substrate 3. In these embodiments, a plurality of positive output conductive-connected regions 51 and the plurality of negative output conductive-connected regions 52 are respectively located between the two positive input conductive-connected regions 53, wherein the two positive input conductive-connected regions 53 are connected to each other via the wiring in the substrate 3 to constitute the positive input terminal Vin+ of the entire power supply system 1.

Each of the negative input conductive-connected regions 54 is used to form the negative input terminal Vin− in the power supply system 1 shown in FIG. 4. As shown in FIGS. 2, 3A and 3B, the number of the negative input conductive-connected regions 54 is two, and the two negative input conductive-connected regions 54 are disposed on the first side 31 of the substrate 3 and are respectively adjacent to a third sidewall 36 and a four sidewall 37 of the substrate 3. In these embodiments, a plurality of positive output conductive-connected regions 51 and the plurality of negative output conductive-connected regions 52 are respectively located between the two negative input conductive-connected regions 54, wherein the two negative input conductive-connected regions 54 are connected to each other via the wiring in the substrate 3 to constitute the negative input terminal Vin− of the entire power supply system 1. In some embodiments, since the negative input terminal Vin− of the power supply system 1 and the negative output terminal Vout− of the power supply system 1 are shorted connection, a setting position of the negative input conductive-connected region 54 constituting the negative input terminal Vin− of the power supply system 1 and a setting position of the negative output conductive-connected region 52 constituting the negative output terminal Vout− of the power supply system 1 can be exchanged with each other. In this embodiment, the positive output conductive-connected region 51, the negative output conductive-connected region 52, the positive input conductive-connected region 53, and the negative input conductive-connected region 54 may be constituted by, but are not limited to, Solder Mask Defined Pads (SMD) or Non-Solder Mask Defined Pads (NSMD).

As shown in FIG. 1 and FIG. 2, a plurality of power units 6 are disposed on the second side 32 of the substrate 3, and each of the power units 6 is connected to the corresponding positive output conductive-connected region 51, the negative output conductive-connected region 52, the positive input conductive-connected region 53 and the negative input conductive-connected region 54 via the wiring in the substrate 3.

It can be seen from the above that the output capacitor 4 of the power supply system 1 of this embodiment is surface-mounted on the second side 22 of the system board 2, and the load RL is disposed on the first side 21 of the system board 2, so that the connection path between the output capacitor 4 and the load RL is very short. That is, the connection path between the output capacitor 4 and the load RL is only the wiring in the system board 2 connected between the output capacitor 4 and the load RL, while the connection impedance between the output capacitor 4 and the load RL is also low, which improves the power supply performance of the power unit 6, thus the overall performance of the power supply system 1 of this embodiment is also improved accordingly. In addition, since each output capacitor 4 is disposed in the corresponding first accommodating groove 331 on the substrate 3, and the output capacitor 4 is located between the corresponding positive output conductive-connected region 51 and the corresponding negative output conductive-connected region 52, it means that the current on the output capacitor Co shown in FIG. 4 can evenly flow to the positive output terminal Vout+ and the negative output terminal Vout−, so that the current equalization effect between the positive output conductive-connected region 51 constituting the positive output terminal Vout+ and the negative output conductive-connected region 52 constituting the negative output terminal Vout− is very significant. Finally, the process is simple and reliable, since the output capacitors Co are all disposed on the system board 2 by using a conventional surface mount process.

Figure 5:
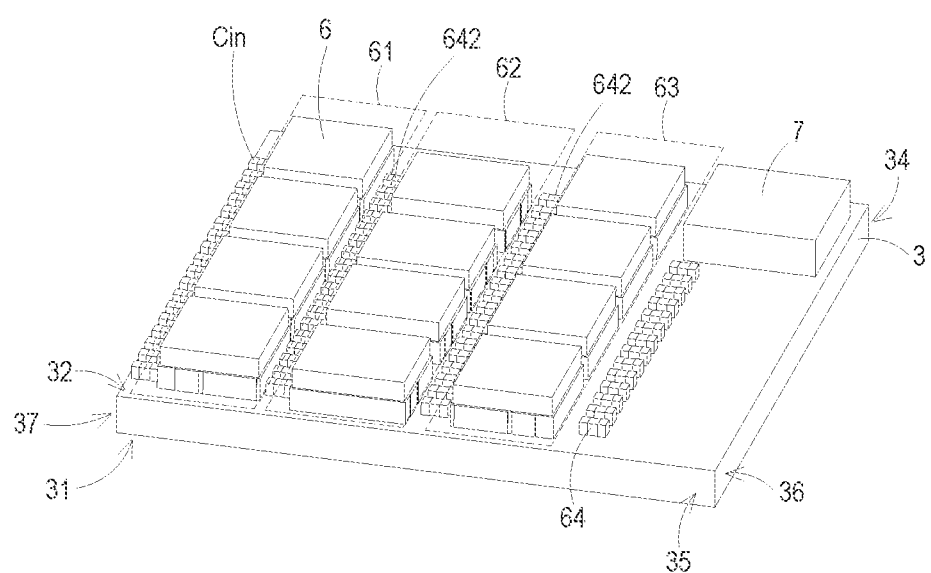
FIG. 5 is a schematic structural diagram of the substrate of the power supply system shown in FIG. 1 and electronic components disposed on the substrate.

Referring to FIG. 5 in conjunction with FIG. 2 and FIG. 3A, FIG. 5 is a schematic structural diagram of the substrate of the power supply system shown in FIG. 1 and the electronic components disposed on the substrate. In this embodiment, the power supply system 1 further includes a controller 7, which is disposed on the second side 32 of the substrate 3 and is adjacent to some of the power units 6, and further adjacent to a junction of the first sidewall 34 and the third sidewall 36 of the substrate 3. The controller 7 is electrically connected to the plurality of power units 6 via the wiring in the substrate 3, and used to control operation states of the switching elements (not shown) in the power units 6. It can be seen from the above that the controller 7 and the power unit 6 of the power supply system 1 of the present embodiment are both disposed on the second side 32 of the substrate 3, so no additional connection line is required between the controller 7 and the power unit 6, so that the connection impedance between the controller 7 and the power unit 6 is greatly reduced, which also reduces the time that the control signal output by the controller 7 transmits to the power unit 6, thereby maintaining the stability of the output voltage of the power supply system 1. In addition, since the controller 7 is disposed on the second side 32 of the substrate 3, the number of electronic elements on the system board 2 can be reduced, so that the area of the system board 2 can be reduced.

Continuing to refer to FIG. 5, in this embodiment, the number of the power units 6 is twelve, and the arrangement of the twelve power units 6 forms three arrangement rows, namely a first arrangement row 61, a second arrangement row 62 and a third arrangement row 63. The first arrangement row 61, the second arrangement row 62 and the third arrangement row 63 are arranged in sequence, and the arrangement direction between the first arrangement row 61, the second arrangement row 62 and the third arrangement row 63 is the same as the direction of the fourth sidewall 37 of the substrate 3 pointing to the third sidewall 36, and each of the first arrangement row 61, the second arrangement row 62 and the third arrangement row 63 includes four power units 6.

In some embodiments, the power unit 6 can package the two switching elements Q1, Q2 and the inductor L shown in FIG. 4 into a single structure, and at the same time, a part of the input capacitors Cin in the power supply system can be integrated into the single structure, and the other part of the input capacitor Cin can be disposed on the second side of the substrate. A plurality of input capacitors Cin are disposed on the second side 32 of the substrate 3, and are sequentially arranged between the first sidewall 34 and the second sidewall 35 of the substrate 3, and the plurality of input capacitors Cin and a plurality of power units 6 are interleaved with each other. As can be seen from the above, the power unit 6 and the input capacitor Cin of the power supply system 1 of the present embodiment are both disposed on the second side 32 of the substrate 3, so no additional connection wire is required between the power unit 6 and the input capacitor Cin, so that the connection impedance between the power unit 6 and the input capacitor Cin is greatly reduced, and the voltage on the input capacitor Cin is not easily attenuated, and after filtering by the input capacitor Cin, the voltage fluctuation of the electric energy is not easily to have impact on the power unit 6. Therefore, the input voltage of the power unit 6 is relatively stable, and since the input capacitor Cin is disposed on the second side 32 of the substrate 3, the number of electronic elements on the system board 2 can be reduced, and the area of the system board 2 can be further reduced. In other embodiments, in order to reduce the volume of the power unit 6, all the input capacitors Cin may be disposed on the second side of the substrate, and only the two switching elements Q1, Q2 and the inductor L shown in FIG. 4 are packaged as an integrally formed single structure, instead of integrating the input capacitors Cin inside the power unit 6.

Figure 6:
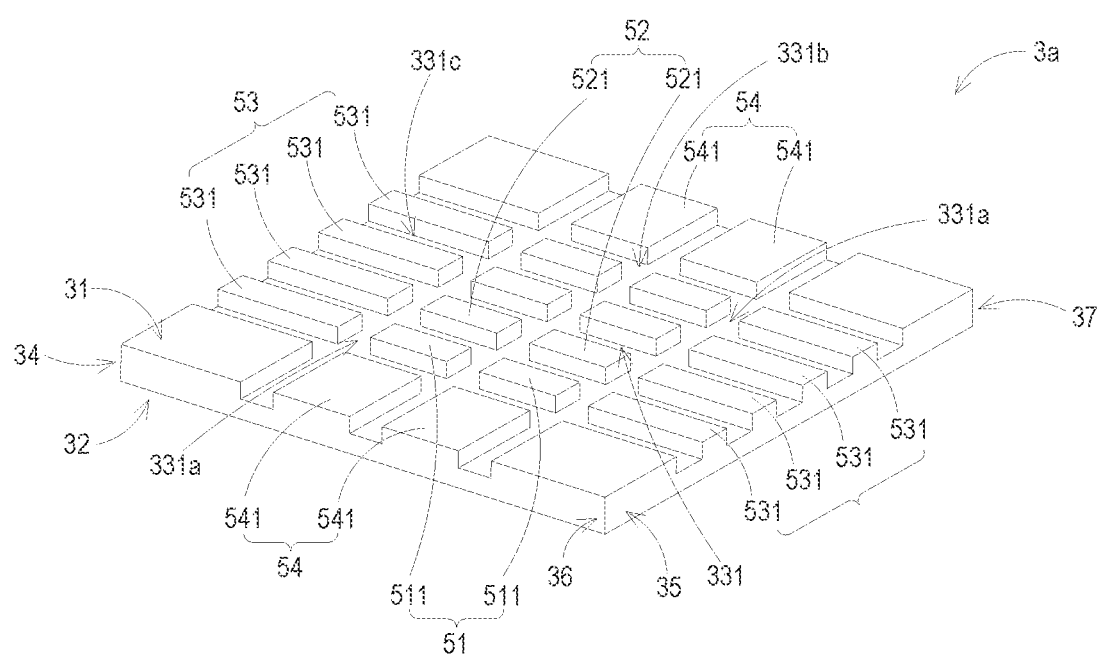
FIG. 6 is a schematic structural diagram of another embodiment of the substrate of the power supply system shown in FIG. 1.

In some embodiments, in order to improve the power supply performance of the power unit 6, the number of the output capacitors 4 needs to be greatly increased, and the number of the accommodating grooves of the substrate also needs to be increased accordingly to accommodate a corresponding number of output capacitors 4. Referring to FIG. 6 in conjunction with FIG. 1, FIG. 6 is a schematic structural diagram of another embodiment of the substrate of the power supply system shown in FIG. 1. As shown in FIG. 6, in addition to the first accommodating grooves 331, the substrate 3a of this embodiment also includes a plurality of second accommodating grooves 331a, a plurality of third accommodating grooves 331b and a plurality of fourth accommodating grooves 331c. The plurality of second accommodating grooves 331a are formed by concaving the first side 31 of the substrate 3a, and run through the third sidewall 36 and the fourth sidewall 37 of the substrate 3a, wherein a part of the second accommodating grooves 331a are located between the positive output conductive-connected region 51 and the positive input conductive-connected region 53, and the other part of the second accommodating grooves 331a are located between the negative output conductive-connected region 52 and the positive input conductive-connected region 53, wherein a plurality of second accommodating grooves 331a are used to accommodate additionally increased output capacitors 4.

The plurality of third accommodating grooves 331b are formed by concaving the first side 31 of the substrate 3a, and runs through the third sidewall 36 and the fourth sidewall 37 of the substrate 3a, and some of the third accommodating grooves 331b divide the positive output conductive-connected region 51 into a plurality of sub-positive output conductive-connected regions 511, for example, two sub-positive output conductive-connected regions 511. The two sub-positive output conductive-connected regions 511 of each positive output conductive-connected region 51 are arranged in sequence and are spaced apart from each other, and the arrangement direction of the two sub-positive output conductive-connected regions 511 is the same as the direction of the first sidewall 34 of the substrate 3 pointing to the second sidewall 35. The other part of the third accommodating grooves 331b divide the negative output conductive-connected region 52 into a plurality of sub-negative output conductive-connected regions 521, for example, two sub-negative output conductive-connected regions 521. The two sub-negative output conductive-connected regions 521 of each negative output conductive-connected region 52 are arranged in sequence and are spaced apart from each other, and the arrangement direction of the two sub-negative output conductive-connected regions 521 is the same as the direction of the first sidewall 34 of the substrate 3 pointing to the second sidewall 35, wherein a plurality of third accommodating grooves 331b are used to accommodate additional increased output capacitors 4. The other part of the third accommodating grooves 331b divide the negative input conductive-connected region 54 into a plurality of sub-negative input conductive-connected regions 541, for example, two sub-negative input conductive-connected regions 541. The two sub-negative input conductive-connected regions 541 of each negative input conductive-connected region 54 are arranged in sequence and spaced apart, and the arrangement direction of the two sub-negative input conductive-connected regions 541 is the same as the direction of the first sidewall 34 of the substrate 3 pointing to the second sidewall 35, wherein a plurality of third accommodating grooves 331b are used to accommodate additional increased output capacitors 4.

The plurality of fourth accommodating grooves 331c are formed by concaving the first side 31 of the substrate 3a, and each of the fourth accommodating groove 331c communicates with the corresponding first accommodating groove 331, wherein the fourth accommodating groove 331c divides the positive input conductive-connected region 53 into a plurality of sub-positive input conductive-connected regions 531, for example, four sub-positive input conductive-connected regions 531. The four sub-positive input conductive-connected regions 531 of each positive input conductive-connected region 53 are arranged in sequence and are spaced apart from each other, and the arrangement direction of the four sub-positive input conductive-connected regions 531 is the same as the direction of the third sidewall 36 of the substrate 3 pointing to the fourth sidewall 37, wherein the plurality of fourth accommodating grooves 331c are used to accommodate additional increased output capacitors 4.

Figure 7:
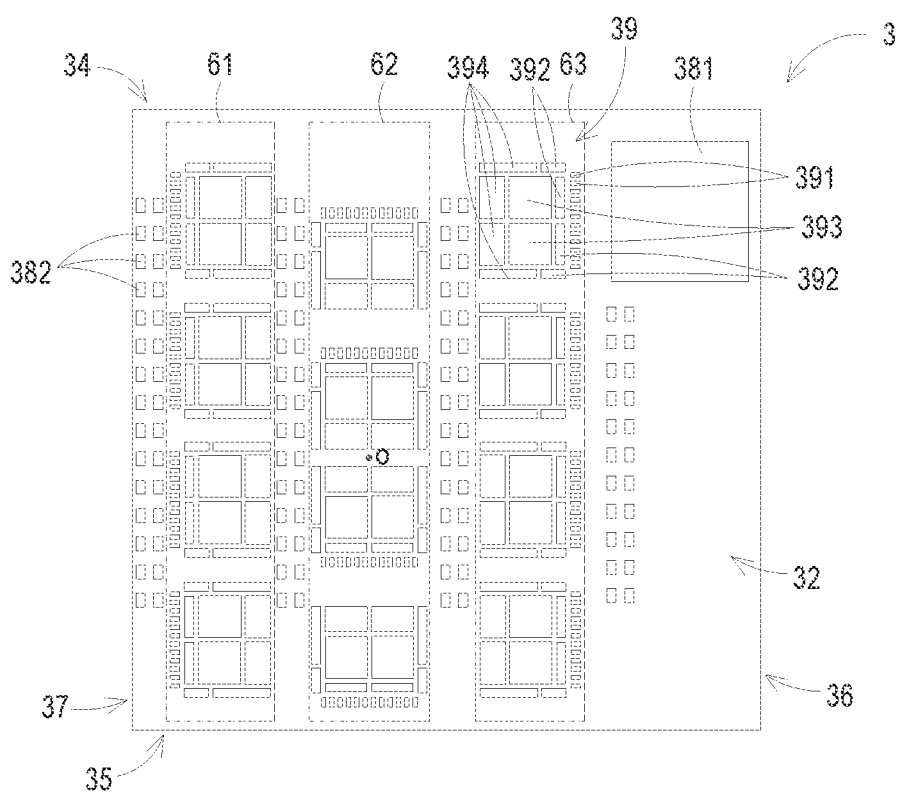
FIG. 7 is a top view of the structure of a second side of the substrate of the power supply system shown in FIG. 1.

Referring to FIG. 7 in conjunction with FIGS. 1 and 2, FIG. 7 is a top view of the structure of the second side of the substrate of the power supply system shown in FIG. 1. As shown in FIG. 7, the second side 32 of the substrate 3 includes a controller pad 381, a plurality of input capacitor pads 382 and a plurality of power unit pads 39. The controller pad 381 is adjacent to the junction of the first sidewall 34 and the third sidewall 36 of the substrate 3, and is used to dispose the controller 7, for example, by welding, so that the controller 7 is disposed on the second side 32 and is electrically coupled to the substrate 3 via the controller pad 381, and the control signal output by the controller 7 can be transmitted to the wiring in the substrate 3 via the controller pad 381.

The plurality of power unit pads 39 on the substrate 3 constitute three arrangement rows, and setting positions of the three arrangement rows constituted by the plurality of power unit pads 39 on the substrate 3 correspond to setting positions of the three arrangement rows constituted by the power units 6 set on the substrate 3, so the first arrangement row 61, the second arrangement row 62 and the third arrangement row 63 in FIG. 7 are also be used to represent three arrangement rows formed by the plurality of power unit pads 39 on the substrate 3, and the setting method of the three arrangement rows will not be repeated here. Each of the power unit pads 39 is used to dispose the corresponding power unit 6, for example, by welding, so that the power unit 6 is disposed on the second side 32 and is electrically coupled to the substrate 3 via the corresponding power unit pad 39. The electrical energy output by the power unit 6 can be transmitted to the wiring in the substrate 3 via the power unit pads 39.

In this embodiment, each of the power unit pads 39 includes a plurality of signal terminals 391, and each of the signal terminals 391 is electrically coupled to the controller 7 via the wiring in the substrate 3. When the power unit 6 is disposed on the corresponding power unit pad 39, the control signal output by the controller 7 is transmitted to the power unit 6 via the corresponding signal terminal 391, wherein the plurality of signal terminals 391 of each power unit pad 39 are set on one sideline relatively far from a center point O of the substrate 3 among four sidelines of the corresponding power unit pad 39. Taking FIG. 7 as an example, the center point O of the substrate 3 is preset as a center position of the three arrangement rows constructed by a plurality of power unit pads 39 on the substrate 3.

Furthermore, in this embodiment, the center point O of the substrate 3 is located between the second power unit 6 and the third power unit 6 of the second arrangement row 62. The signal terminals 391 of the four power unit pads 39 in the first arrangement row 61 are all located on one sideline relatively far from the center point O of the substrate 3 among the four sidelines of the corresponding power unit pad 39, that is, one sideline adjacent to the fourth sidewall 37 of the substrate 3 among the four sidelines of the power unit pad 39. The signal terminals 391 of the two power unit pads 39 adjacent to the first sidewall 34 of the substrate 3 in the second arrangement row 62 are all located in one sideline relatively far away from the center point O of the substrate among four sidelines of the corresponding power unit pad 39, that is, located in one sideline adjacent to the first sidewall 34 of the substrate 3 among four sidelines of the power unit pad 39. The signal terminals 391 of the two power unit pads 39 adjacent to the second sidewall 35 of the substrate 3 in the second arrangement row 62 are all located in one sideline relatively far away from the center point O of the substrate 3 among four sidelines of the corresponding power unit pad 39, that is, located in one sideline adjacent to the second sidewall 35 of the substrate 3 among four sidelines of the power unit pad 39. The signal terminals 391 of the four power unit pads 39 in the third arrangement row 63 are all located in one sideline relatively far away from the center point O of the substrate 3 among four sidelines of the corresponding power unit pad 39, that is, located in one sideline adjacent to the third sidewall 36 of the substrate 3 among four sidelines of the power unit pad 39. The above setting position of the signal terminals 391 of the power unit pad 39 can make the wiring arrangement inside the substrate 3 more flexible.

Of course, each of the power unit pads 39 also includes more types of terminals, such as an input terminal 392, an output terminal 393, and a ground terminal 394, and so on. Among them, the signal terminal 391, the input terminal 392, the output terminal 392, and the ground terminal 394 may be constituted by, but not limited to, a Solder Mask Defined Pad (SMD) or a Non-Solder Mask Defined Pad (SMD). The setting of the input terminal 392, the output terminal 393 and the ground terminal 394 will be described in detail later.

The plurality of input capacitor pads 382 are sequentially arranged between the third sidewall 36 and the fourth sidewall 37 of the substrate 3 in the form of four arrangement rows. The four arrangement rows formed by the plurality of input capacitor pads 381 are interleaved with the three arrangement rows formed by the plurality of power unit pads 39, that is, one arrangement row formed by the corresponding power unit pads 39 is located between every two adjacent arrangement rows of the plurality of input capacitor pads 381. The plurality of input capacitor pads 382 in each of the arrangement rows are arranged in sequence; and the arrangement direction is the same as the direction of the first sidewall 34 of the substrate 3 pointing to the second sidewall 35. Each input capacitor pad 382 is in contact with a corresponding input capacitor Cin, so that the input capacitors Cin are electrically coupled to the substrate 3 via the corresponding input capacitor pad 382, thereby performing power transfer between the substrate 3 and the input capacitors Cin.

Figure 8:
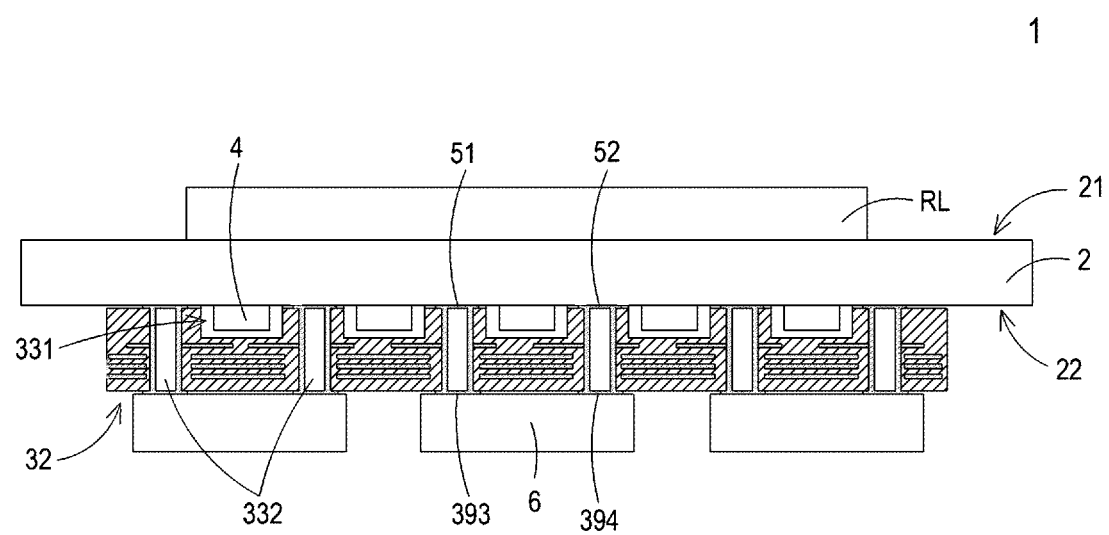
FIG. 8 is a schematic cross-sectional structural diagram showing a connection hole of the power supply system shown in FIG. 1.

In some embodiments, the interconnection between the various conductive-connected regions located on the first side 31 of the substrate 3 and the various terminals of the power unit pads 39 located on the second side 32 of the substrate 3 can be implemented in various ways, for example, a connection hole is provided in the substrate 3 for electrical connection. Referring to FIG. 8 in conjunction with FIG. 1, FIG. 2 and FIG. 7, FIG. 8 is a schematic cross-sectional structural diagram showing the connection hole of the power supply system shown in FIG. 1. As shown in FIG. 8, the substrate 3 further includes a plurality of connection holes 332, each connection hole 332 runs through the first side 31 and the second side 32 of the substrate 3, and each connection hole 332 can be a through hole structure with a conductive function or a blind buried hole structure. The setting position of one terminal of the connection hole 332 corresponds to the input terminal 392, the output terminal 393 or the ground terminal 394 of the power unit pad 39, and the setting position of the other terminal of the connection hole 332 corresponds to the positive input conductive-connected region 53, the positive output conductive-connected region 51, the negative output conductive-connected region 52 or the negative input conductive-connected region 54. The input terminal 392 of each power unit pad 39 is connected to the positive input conductive-connected region 53 via the corresponding connection hole 332, and the positive input terminal of the power unit 6 receives the electric energy from the system board 2 via the input terminal 392 of the power unit pad 39 on the substrate 3, the corresponding connection hole 332 and the positive input conductive-connected region 53. The output terminal 393 of each power unit pad 39 is connected to the positive output conductive-connected region 51 via the corresponding connection hole 332, and the electric energy of the positive output terminal of the power unit 6 is transmitted to the system board 2 via the output terminal 393 of the power unit pad 39 on the substrate 3, the corresponding connection hole 332 and the positive output conductive-connected region 51. The ground terminal 394 of each power unit pad 39 is connected to the negative output conductive-connected region 52 or the negative input conductive-connected region 54 via the corresponding connection hole 332, and the electric energy of the negative output terminal of the power unit 6 is transmitted to the system board 2 via the ground terminal 394 of the power unit pad 39 on the substrate 3, the corresponding connection hole 332 and the negative output conductive-connected region 52, and the electric energy of the negative input terminal of the power unit 6 is transmitted to the system board 2 via the ground terminal 394 of the power unit pad 39 on the substrate 3, the corresponding connection hole 332 and the negative input conductive-connected region 54. FIG. 8 only shows the example that the output terminal 393 is connected to the positive output conductive-connected region 51 via the corresponding connection hole 332, and the ground terminal 394 of the power unit pad 39 is connected to the negative output conductive-connected region 52 via the corresponding connection hole 332, and another example that the input terminal 392 is connected to the positive input conductive-connected region 53 via the corresponding connection hole 332, and the ground terminal 394 is connected to the negative input conductive-connected region 54 via the corresponding connecting hole 332 can also be connected in a similar manner, and this will not be described. As can be seen from the above, since the substrate 3 is located between the power unit 6 and the system board 2, the input power received on the system board 2 can be directly transmitted to the power unit 6 via the connection holes 332 in the substrate 3, and the power unit 6 will convert the input energy and then transmit it to the system board 2 via the connection holes 332 in the substrate 3. Since the output capacitor 4 is directly surface-mounted to the second side 22 of the system board 2, the converted energy received by the system board 2 can be directly transmitted to the output capacitor 4 and the load RL via the wiring in the system board 2. Therefore, it can be seen that the setting method of the power supply system 1 of the present disclosure makes the connection path between the output capacitor 4 and the load RL shorter, and greatly reduces the transmission impedance between the output capacitor 4 and the load RL.

In order to prevent the first side 31 of the substrate 3 from being bent when the first accommodating groove 331 is formed by the groove milling process, which will affect the welding between the substrate 3 and the system board 2, in some embodiments, a raw substrate without the first accommodating groove 331 (hereinafter referred to as the raw substrate 3) is optimized, for example, the density of wiring layers in the raw substrate 3 adjacent to the first side 31 of the raw substrate 3 is increased, and the density of wiring layers in the raw substrate 3 adjacent to the second side 32 of the raw substrate 3 is reduced, so that the stress of a portion of the raw substrate 3 adjacent to the four sidewalls of the raw substrate 3 is relatively smaller, and the stress of the other portion of the raw substrate 3 adjacent to the central position of the raw substrate 3 is relatively larger, thus causing the pre-bending of the raw substrate 3. When the first accommodating groove 331 is set on the first side 31 of the raw substrate 3 by a groove milling process to form the substrate 3, the stress at the center of the substrate 3 can be relieved to ensure the flatness of substrate 3. In other embodiments, when the first accommodating groove 331 is set on the first side 31 of the substrate 3 by a groove milling process, the second side 32 of the substrate 3 is also simultaneously formed with additional grooves by a groove milling process or a drilling method, so that the first side 31 and the second side 32 of the substrate 3 have the same degree of stress release and ensure the flatness of the substrate 3.

Figure 9:
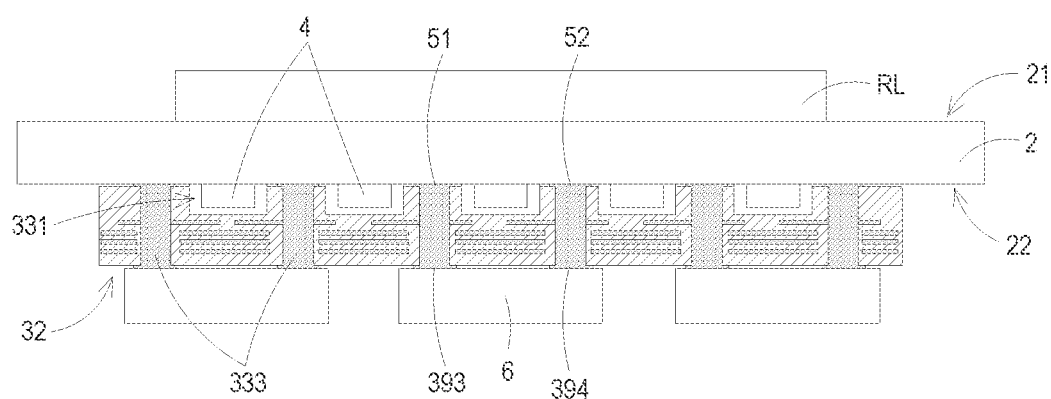
FIG. 9 is a schematic cross-sectional structure diagram of a power supply system according to a second embodiment of the disclosure.

Referring to FIG. 9, which is a schematic cross-sectional structure diagram of a power supply system according to a second embodiment of the present disclosure. The power supply system 1a of the present embodiment is similar to the power supply system 1 shown in FIG. 1, and compared with the power supply system 1 shown in FIG. 1 being connected, using the connection holes, between the conductive-connected regions and the terminals corresponding to the power unit pads 39, the power supply system 1a of this embodiment includes a plurality of copper pillars 333, each of the copper pillars 333 is embedded in the substrate 3, and a setting position of one terminal of the copper pillar 333 corresponds to the input terminal 392, the output terminal 393 or the ground terminal 394 of the power unit pad 39, and a setting position of the other terminal of the copper pillars 333 corresponds to the positive input conductive-connected region 53, the positive output conductive-connected region 51, the negative output conductive-connected region 52 or the negative input conductive-connected region 54. The input terminal 392 of each power unit pad 39 is connected to the positive input conductive-connected region 53 via the corresponding copper pillar 333, and the output terminal 393 of each power unit pad 39 is connected to the positive output conductive-connected region 51 via the corresponding copper pillar 333, and the ground terminal 394 of each power unit pad 39 is connected to the negative output conductive-connected region 52 or the negative input conductive-connected region 54 via the corresponding copper pillar 333. Therefore, the power supply system 1a of the present embodiment can meet the current flow requirement between the corresponding conductive-connected region on the first side 31 of the substrate 3 and the terminals corresponding to the power unit pads 39 on the second side 32 of the substrate 3, and when the current between the corresponding conductive-connected region on the first side 31 of the substrate 3 and the terminals corresponding to the power unit pads 39 on the second side 32 of the substrate 3 is relatively larger, the effective conductive-connected region area achieved by the copper pillars 333 is relatively larger, thus leading to higher stability of current transmission. In addition, since the substrate 3 is located between the system board 2 and the power unit 6, the heat energy generated by the power unit 6 can be conducted to the system board 2 via the copper pillars 333 in the substrate 3, and dissipate heat via the heat sink (not shown) on the system board 2.

Figure 10:
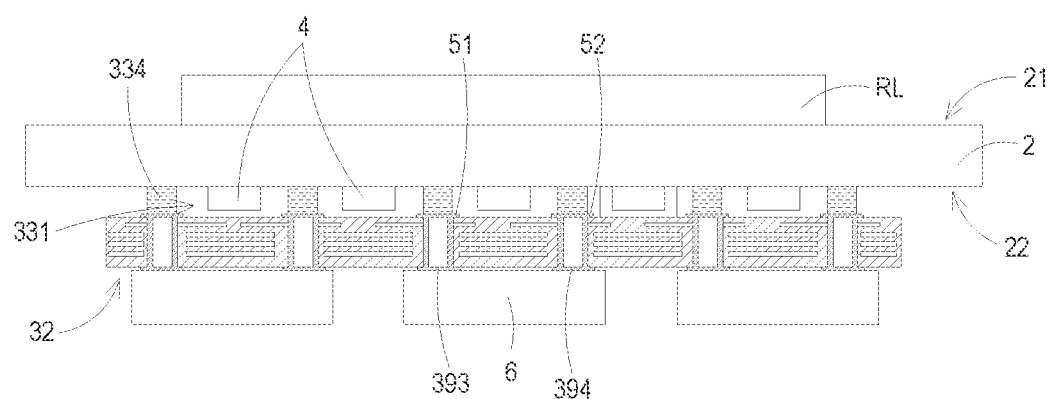
FIG. 10 is a schematic cross-sectional structure diagram of a power supply system according to a third embodiment of the present disclosure.
Figure 11:
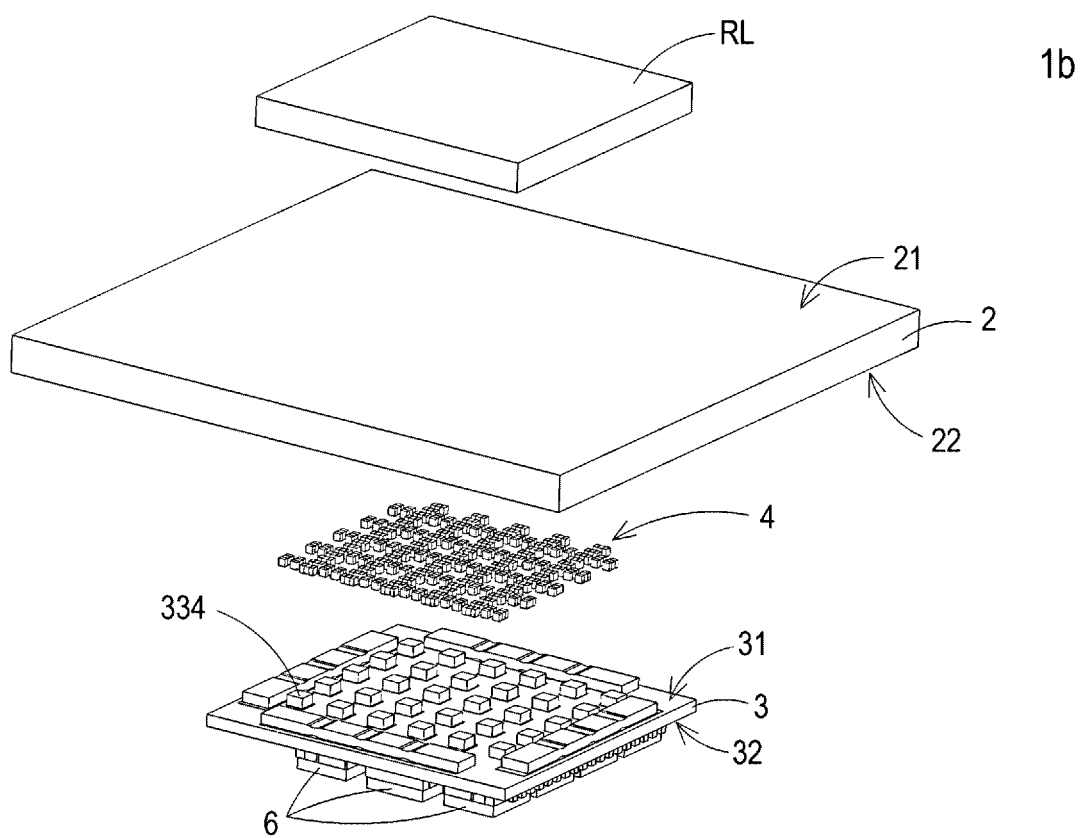
FIG. 11 is a schematic diagram of an exploded structure of the power supply system shown in FIG. 10.

Referring to FIGS. 10 and 11, wherein FIG. 10 is a schematic cross-sectional structure diagram of a power supply system according to a third embodiment of the disclosure and FIG. 11 is a schematic exploded structure diagram of the power supply system shown in FIG. 10. The power supply system 1b of the present embodiment is similar to the power supply system 1 shown in FIG. 1, and compared with the first side 31 of the substrate 3 of the power supply system 1 shown in FIG. 1 directly being surface-mounted to the second side 22 of the system board 2, and a first accommodating groove 331 being formed on the first side 31 of the substrate 3 by way of milling grooves, the first side 31 of the substrate 3 of the power supply system 1b of this embodiment is spaced from the second side 22 of the system board 2 and the power supply system 1b also includes a plurality of conductive structures 334. Each of the conductive structures 334 is composed of conductive pillars, each of the conductive structures 334 can be an integrally formed structure or a segmented structure composed of a plurality of components, one terminal of each conductive structure 334 is connected to the second side 22 of the system board 2, and the other terminal of each conductive structure 334 is connected to a corresponding conductive-connected region among the positive output conductive-connected region 51, the negative output conductive-connected region 52, the positive input conductive-connected region 53 or negative input 1 conductive-connected region 54 on the first side 31 of the substrate 3. In addition, each conductive structure 334, another adjacent conductive structure 334, the first side 31 of the substrate 3 and the second side 22 of the system board 2 define a first accommodating groove 331 together. Each first accommodating groove 331 is used to accommodate the corresponding output capacitor 4. In some embodiments, the two terminals of each conductive structure 334 used for welding can be wavy surfaces to achieve the effect of exhausting gas. Of course, the formation method and arrangement position of the conductive structure 334 are not limited, and are not described herein. As can be seen from the above, since the output capacitor 4 is located between the substrate 3 and the system board 2, and the output capacitor 4 is directly surface-mounted to the second side 22 of the system board 2, the electric energy transmitted by the power unit 6 is sequentially transmitted to the system board 2 via the substrate 3 and the conductive structure 334, and further transmitted to the output capacitor 4 and the load RL via the wiring in the system board 2.

Figure 12:
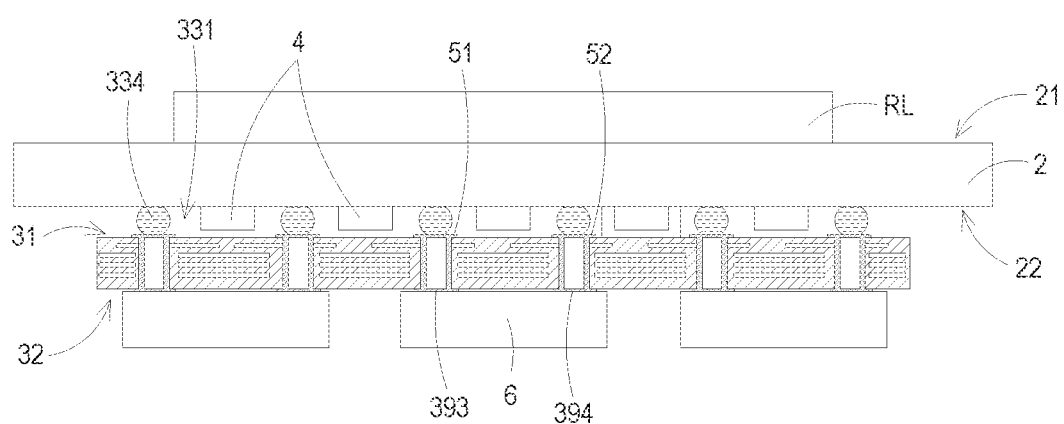
FIG. 12 is a schematic cross-sectional structure diagram of a power supply system according to a fourth embodiment of the disclosure.

In some embodiments, the conductive structures 334 can be formed not only in the structure of conductive pillars, but also in the structure of solder balls, and the formation method can be a Ball Grid Array (BGA), as shown in FIG. 12. FIG. 12 is a schematic cross-sectional structure diagram of a power supply system according to a fourth embodiment of the present disclosure. In order to avoid the possible collapse problem of the solder balls, the conductive structure 334 can be formed by using the solder balls with high temperature core, such as copper cores or high melting point solder cores. In some embodiments, in order to take into account both the collapse of the solder balls and cost considerations, solder balls with high temperature cores are arranged at four corners of the first side 31 of the substrate 3, and conventional solder balls are arranged at the remaining positions of the first side 31 of the substrate 3, so as to use the solder balls at the four corners of the substrate 3 to control the collapse of the solder balls at the remaining positions of the substrate 3, thereby improving the process yield of the power supply system 1c of this embodiment. In addition, since the power supply system 1b of the previous embodiment and the power supply system 1c of the present embodiment are directly provided with the conductive structure 334 to connect the substrate 3 and the system board 2 without additional processing of the substrate 3, the flatness of the power supply system 1b of the previous embodiment and the power supply system 1c of this embodiment is relatively high.

Figure 13:
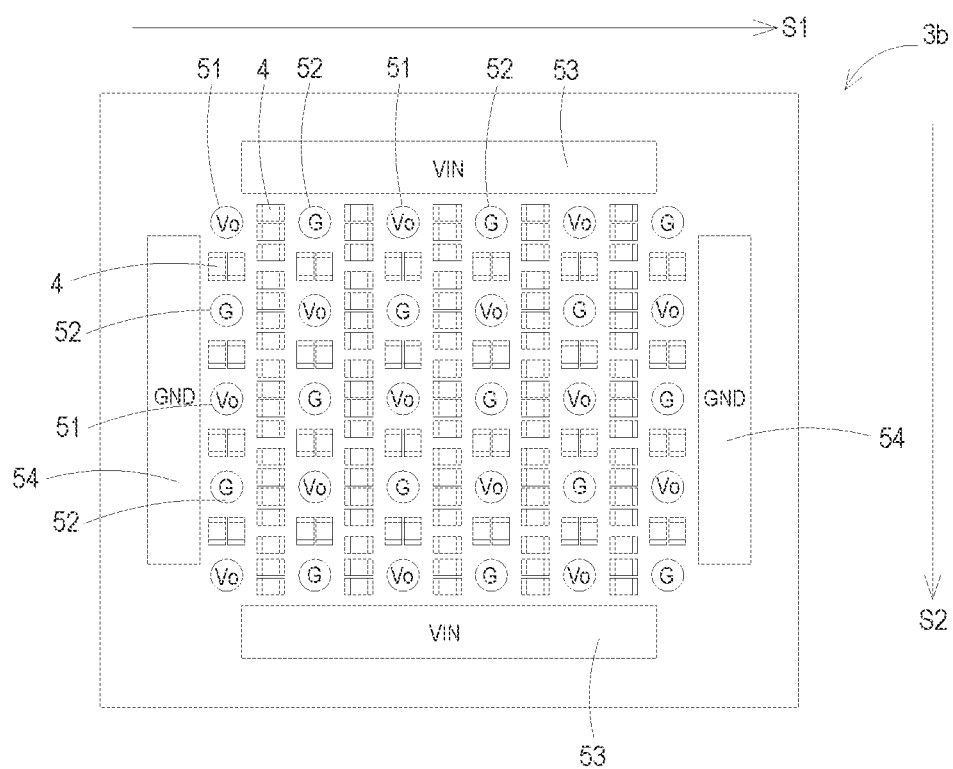
FIG. 13 is a schematic diagram of setting positions for another embodiment of various conductive-connected regions of the power supply system shown in FIG. 1.
Figure 14:
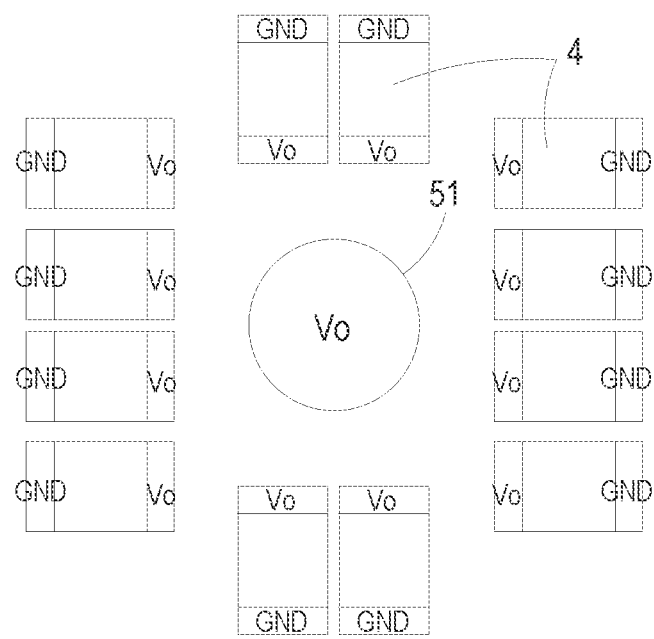
FIG. 14 is a schematic diagram showing a polarity relationship between positive output conductive-connected regions and adjacent output capacitors shown in FIG. 13.

In some embodiments, the setting positions of the plurality of positive output conductive-connected regions 51 and the plurality of negative output conductive-connected regions 52 on the first side 31 of the substrate 3 are not limited to the positions shown in FIGS. 2 and 3A, and can be adjusted according to needs. Referring to FIG. 13 and FIG. 14, wherein FIG. 13 is a schematic diagram showing the setting positions of various conductive-connected regions of the power supply system shown in FIG. 1 according to another embodiment, and FIG. 14 is a schematic diagram showing a polarity relationship between positive output conductive-connected regions and adjacent output capacitors shown in FIG. 13. As shown in FIG. 13, the plurality of positive output conductive-connected regions 51 and the plurality of negative output conductive-connected regions 52 of the substrate 3b of the present embodiment are interleaved with each other, and there is one corresponding negative output conductive-connected region 52 between every two adjacent positive output conductive-connected regions 51, and there is one corresponding positive output conductive-connected region 51 between every two adjacent negative output conductive-connected regions 52, wherein each output capacitor 4 is disposed between two adjacent conductive-connected regions, for example, disposed between the corresponding positive output conductive-connected region 51 and the corresponding negative output conductive-connected region 52. As shown in FIG. 13, in this embodiment, the positive output conductive-connected region 51 and the negative output conductive-connected region 52 connected to the output capacitor 4 are interleaved along the first direction S1, and are also interleaved along the second direction S2. The second direction S2 is perpendicular to the first direction S1. The current flows from the positive output conductive-connected region 51 via the output capacitor 4 to the negative output conductive-connected region 52, so as to form an output loop. Along the first direction, the current directions of the adjacent output loops are opposite, so that parasitic inductances of the adjacent output loops are partially offset, the efficiency of the power supply system is further improved; and along the second direction, the current directions of the adjacent output loops are also opposite, so that parasitic inductances of the adjacent output loops are partially offset, and the efficiency of the power supply system is further improved.

In FIG. 14, the positive output conductive-connected region 51 and the adjacent output capacitor 4 are used as examples to illustrate the polarities of the terminals of the output capacitor 4. In FIG. 14, a terminal on the output capacitor 4 is marked with Vo, which means that it is electrically connected with the positive output terminal Vout+. In FIG. 14, the other terminal on the output capacitor 4 is marked with GND, which means that it is electrically connected with the negative output terminal Vout−. As shown in FIG. 14, according to the setting method of FIG. 13, the polarity of the terminal adjacent to the positive output conductive-connected region 51 among the two terminals of each of output capacitors 4 is the same as the polarity of the positive output conductive-connected region 51. Of course, the polarities of the negative output conductive-connected region 52 and the terminals of the adjacent output capacitor 4 are also similar to that in FIG. 14, that is, the polarity of the terminal adjacent to the negative output conductive-connected region 52 among the two terminals of each output capacitor 4 is the same as the polarity of the negative output conductive-connected region 52, which is not repeated here. Due to the above-mentioned polarity characteristics of the terminals of the output capacitor 4, if the conductive structure connected to the positive output conductive-connected region 51 and the conductive structure connected to the negative output conductive-connected region 52 are accidentally connected to each other, there also no short circuit. In this embodiment, the shape of each positive output conductive-connected region 51 and the shape of each negative output conductive-connected region 52 are respectively circle, so that the area occupied by the positive output conductive-connected region 51 and the negative output conductive-connected region 52 on the first side 31 of the substrate 3 is relatively small, therefore on the premise that the area of the first side 31 of the substrate 3 is fixed, the number of the output capacitors 4 can be increased. Furthermore, since the plurality of the output capacitors 4 are connected in parallel, the equivalent series resistance of the increased number of output capacitors 4 decreases, so that the stability of the output voltage of the power supply system is improved.

Figure 15:
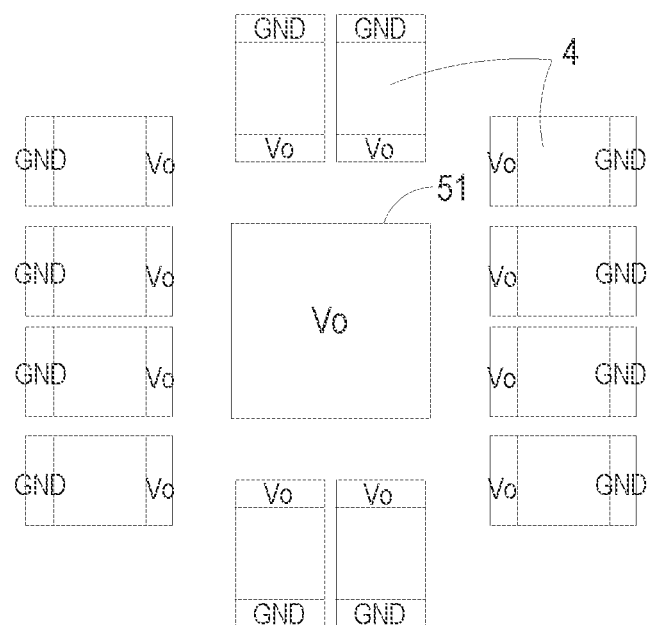
FIG. 15 is a schematic diagram of a polarity relationship of another embodiment of positive output conductive-connected regions and adjacent output capacitors shown in FIG. 13.

In other embodiments, the shape of each of positive output conductive-connected regions 51 is not limited to the circle shown in FIG. 14. FIG. 15 is schematic diagram of another exemplary polarity relationship of positive output conductive-connected regions and adjacent output capacitors shown in FIG. 13. As shown in FIG. 15, the shape of each positive output conductive-connected region 51 is a square respectively. Compared with the positive output conductive-connected region 51 which is a circle, the area of each positive output conductive-connected region 51 is increased, so that the current density flowing through the positive output conductive-connected region 51 is smaller. Of course, the shape of each negative output conductive-connected region 52 can also be a square, which will not be repeated here.

Figure 16:
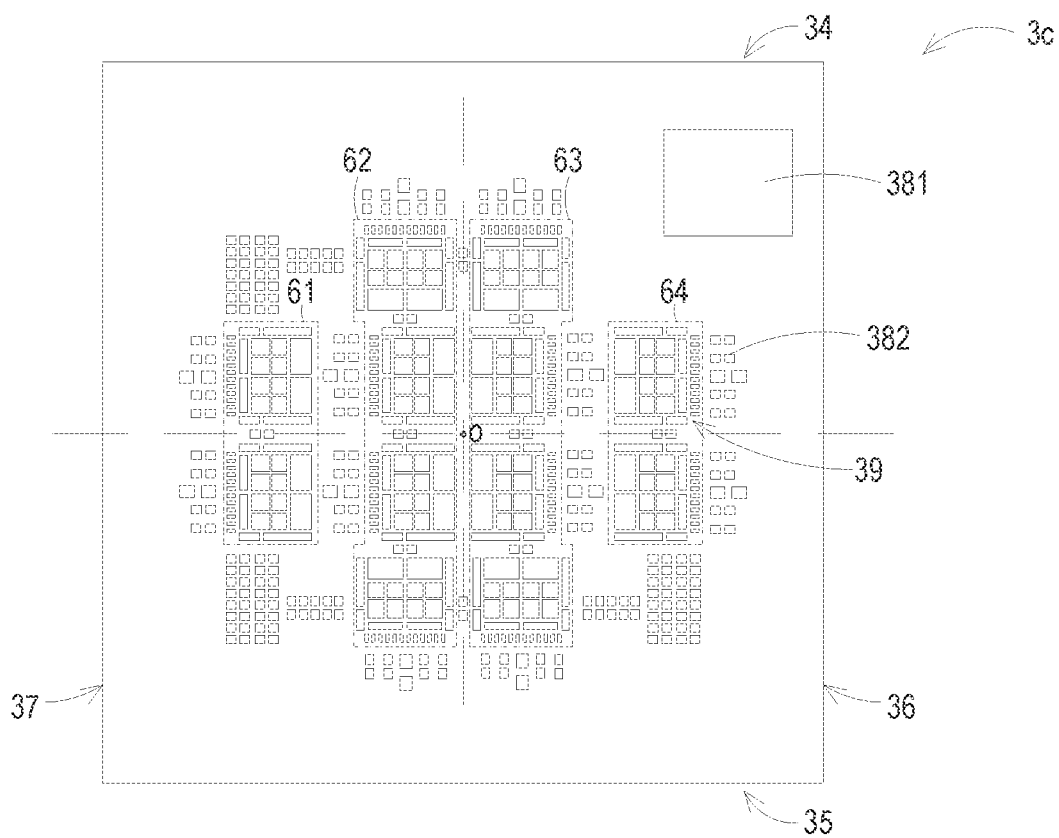
FIG. 16 is a schematic structural diagram of a second side of a substrate of a power supply system according to a fifth embodiment of the disclosure.
Figure 17:
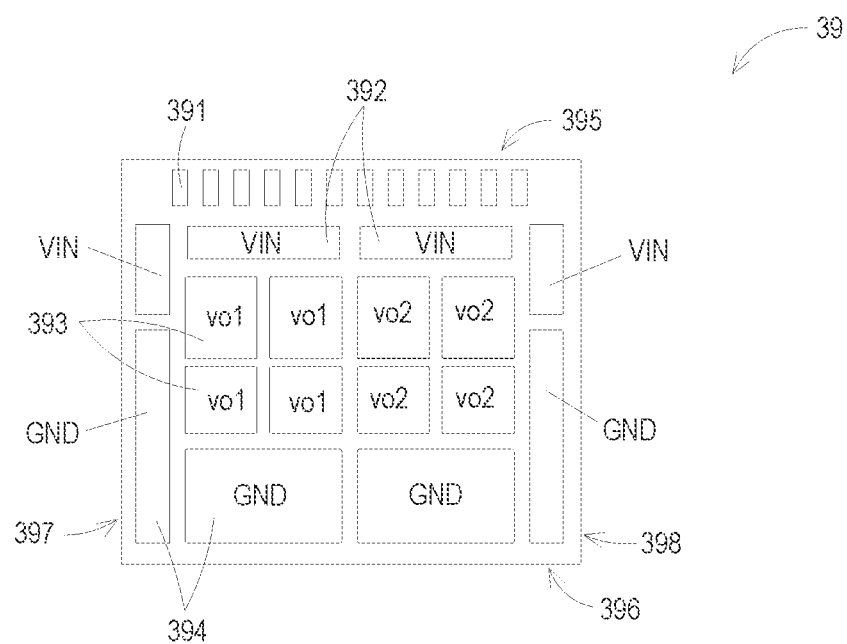
FIG. 17 is an enlarged schematic view of a first embodiment of the power unit pad of the power supply system shown in FIG. 16.

In some embodiments, the controller pads 381, the plurality of input capacitor pads 382 and the plurality of power unit pads 39 on the second side 32 of the substrate 3 are not limited to the arrangement shown in FIG. 7. Referring to FIGS. 16 and 17, FIG. 16 is a schematic structural diagram of the second side of the substrate of the power supply system according to the fifth embodiment of the disclosure, and FIG. 17 is an enlarged schematic view of a first embodiment of the power unit pad of the power supply system shown in FIG. 16. The second side 32 of the substrate 3c of the present embodiment is similar to the second side 32 of the substrate 3 shown in FIG. 7, but including a controller pad 381, a plurality of input capacitor pads 382 and a plurality of power unit pads 392. Compared with the setting positions of the plurality of power unit pads 39 as shown in FIG. 7, which constitute three arrangement rows, the setting positions of the plurality of power unit pads 39 in this embodiment constitute four arrangement rows, namely the first arrangement row 61, the second arrangement row 62, the third arrangement row 63 and the fourth arrangement row 64. Of course, the plurality of power units 6 corresponding to the plurality of power unit pads 39 are also set in four arrangement rows, and will not be described here.

In this embodiment, each power unit pad 39 includes a plurality of signal terminals 391, wherein the plurality of signal terminals 391 of each power unit pad 39 are set to one sideline relatively far from a center point O of the substrate 3 among four sidelines of the corresponding power unit pad 39. As shown in FIG. 16, the center point O of the substrate 3 is located at a center position between the second power unit 6 in the second arrangement row 62, the third power unit 6 in the second arrangement row 62, the second power unit 6 in the third arrangement row 63 and the third power unit 6 in the third arrangement row 63, while the signal terminals 391 of the two power unit pads 39 in the first arrangement row 61 are all located on one sideline relatively far from the center point O of the substrate 3 among the four sidelines of the corresponding power unit pad 39, that is, one sideline adjacent to the fourth sideline 37 of the substrate 3 among the four sidelines of the power unit pad 39. The signal terminals 391 of the two power unit pads 39 respectively adjacent to the first sidewall 34 and the second sidewall 35 of the substrate 3 in the second arrangement row 62 are respectively located in one sideline relatively far away from the center point O of the substrate among four sidelines of the corresponding power unit pad 39, that is, respectively located in one sideline adjacent to the first sidewall 34 and the second sidewall 35 of the substrate 3 among four sidelines of the power unit pad 39. The signal terminals 391 of the two power unit pads 39 adjacent to the center point O of the substrate 3 in the second arrangement row 62 are all located in one sideline adjacent to the fourth sidewall 37 of the substrate 3 among four sidelines of the corresponding power unit pad 39. The signal terminals 391 of the two power unit pads 39 respectively adjacent to the first sidewall 34 and the second sidewall 35 of the substrate 3 in the third arrangement row 63 are respectively located in one sideline relatively far away from the center point O of the substrate 3 among four sidelines of the corresponding power unit pad 39, that is, respectively located in one sideline adjacent to the first sidewall 34 of the substrate 3 and one side line adjacent to the second sidewall 35 of the substrate 3 among four sidelines of the corresponding power unit pad 39. The signal terminals 391 of the two power unit pads 39 adjacent to the center point O of the substrate 3 in the third arrangement row 63 are all located in one sideline adjacent to the third sidewall 36 of the substrate 3 among four sidelines of the corresponding power unit pad 39, while the signal terminals 391 of the two power unit pads 39 in the fourth arrangement row 64 are all located in one sideline relatively far away from the center point O of the substrate 3 among four sidelines of the corresponding power unit pad 39, i.e., located in one sideline adjacent to the third sidewall 36 of the substrate 3 among four sidelines of the corresponding power unit pad 39.

The above arrangement shortens the path distance between the power unit 6 connected with the power unit pad 39 and the controller 7 connected with the controller pad 381, and reduces the signal delay of the control signal of the power unit 6. In this embodiment, each input capacitor pad 382 is adjacent to the signal terminal 391 of the corresponding power unit pad 39, so that the path distance between the input capacitor Cin connected with the input capacitor pad 382 and the power unit 6 connected with power unit pad 39 is reduced. In addition, combining the above-mentioned pad arrangement, the path distance between the power unit 6 connected with the second side 32 of the substrate 3 and the load RL connected with the first side 31 of the substrate 3 is also shortened, so that the impedance between the power unit 6 and the load RL is reduced and the current uniformity of the power unit 6 is improved. In this embodiment, each power unit 6 can be a one-phase, two-phase or multi-phase buck circuit, wherein if the power unit 6 is a multi-phase circuit, the power density of each power unit 6 can be greatly improved, so that the electrical energy required by the load RL can be provided even the required number of power units 6 in the power supply system is relatively low.

As shown in FIG. 17, each power unit pad 39 has a first sidewall 395, a second sidewall 396, a third sidewall 397 and a fourth sidewall 398, wherein the first sidewall 395 of the power unit pad 39 and the second sidewall 396 of the power unit pad 39 are disposed opposite to each other, and the third sidewall 397 of the power unit pad 39 and the fourth sidewall 398 of the power unit pad 39 are disposed opposite to each other, and are located between the first sidewall 395 and the second sidewall 396. Furthermore, in addition to a plurality of signal terminals 391, each power unit pad 39 further has a plurality of input terminals 392, a plurality of output terminals 393 and a plurality of ground terminals 394. The plurality of signal terminals 391 are sequentially arranged adjacent to the first sidewall 395 of the power unit pad 39 in sequence. The plurality of output terminals 393 are set at the center position of the power unit pad 39. The plurality of input terminals 392 and the plurality of ground terminals 394 are sequentially set around the plurality of output terminals 393, wherein a part of the plurality of input terminals 392 are adjacent to the third sidewall 397 of the power unit pad 39, a part of the plurality of input terminals 392 are adjacent to the fourth sidewall 398 of the power unit pad 39, and another part of the plurality of input terminals 392 are located between the signal terminals 391 and the output terminals 393, and a part of the plurality of ground terminals 394 are adjacent to the third sidewall 397 of the power unit pad 39, a part of the plurality of ground terminals 394 are adjacent to the second sidewall 396 of the power unit pad 39, and another part of the plurality of ground terminals 394 are adjacent to the fourth sidewall 398 of the power unit pad 39. In this embodiment, the connection holes in the substrate 3 connected to various terminals can be blind via structures, so as to reduce the spacing between the plurality of connection holes, thereby increasing the number of connection holes in the substrate 3 to achieve higher current flow capacity.

Figure 18:
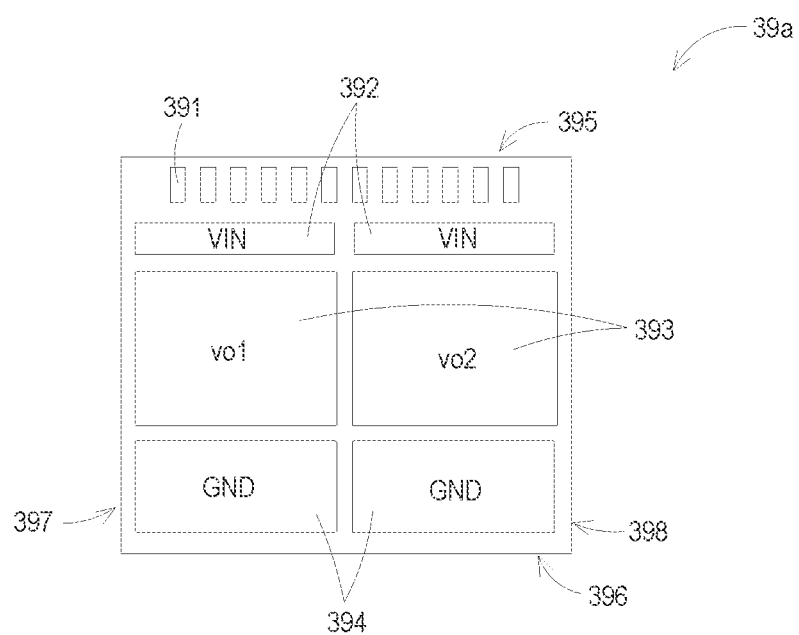
FIG. 18 is an enlarged schematic view of a second embodiment of power unit pad of the power supply system shown in FIG. 16.
Figure 19:
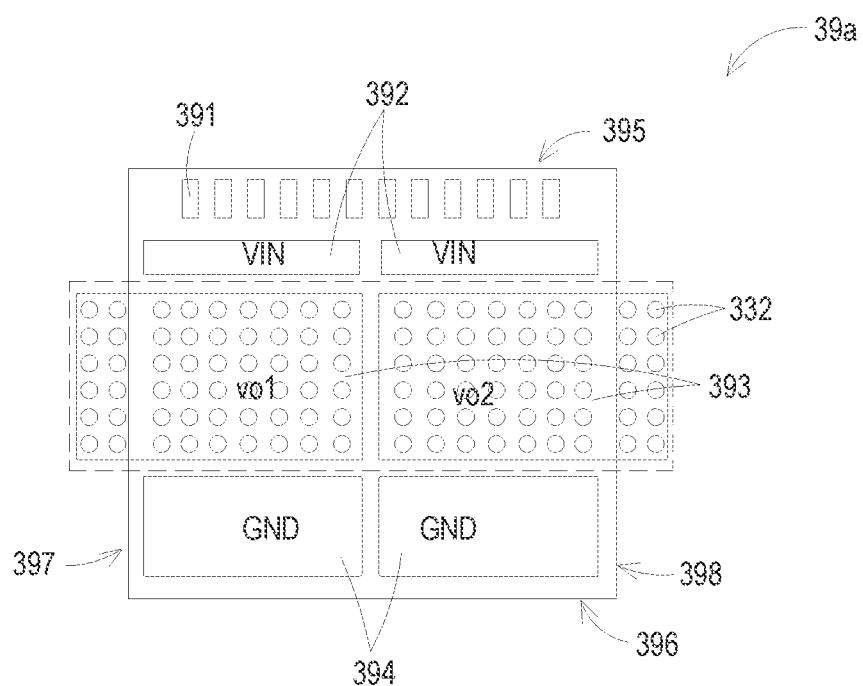
FIG. 19 is an enlarged schematic view of a third embodiment of the power unit pad of the power supply system shown in FIG. 16.

In other embodiments, the setting positions of various terminals on the power unit pads are not limited to those shown in FIG. 17. Referring to FIG. 18, FIG. 18 is an enlarged schematic view of a second embodiment of power unit pad of the power supply system shown in FIG. 16. In this embodiment, the plurality of signal terminals 391 of the power unit pad 39a are adjacent to the first sidewall 395 of the power unit pad 39 and sequentially arranged, and the plurality of ground terminals 394 are adjacent to the second sidewall 396 of the power unit pad 39 and sequentially arranged, and the plurality of input terminals 392 are arranged in sequence and located between the plurality of signal terminals 391 and the plurality of output terminals 393, and the plurality of output terminals 393 are arranged in sequence and are located between a plurality of input terminals 392 and a plurality of ground terminals 394. Because the current flowing through the output terminal 393 is larger, so in some embodiments, the setting range of the output terminals 393 is increased for the actual needs of the circuit, so that the setting positions of the output terminals 393 may protrude from the third sidewall 397 and the fourth sidewall 398 of the power unit pad 39, shown in FIG. 19, which is an enlarged schematic view of a third embodiment of the power unit pad of the power supply system shown in FIG. 16. In order to correspondingly connect the output terminals 393 protruding from the third sidewall 397 and the fourth sidewall 398 of the power unit pad 39, a larger number of connection holes 332 may be provided on the substrate 3 to connect the output terminals 393 protruding from of the third sidewall 397 and the fourth sidewall 398 of the power unit pad 39, and the above arrangement can achieve a higher current flow capacity.

Embodiments of the present disclosure also provide an electronic device, which includes a load RL and any one of the power supply system 1, the power supply system 1a, the power supply system 1b, and the power supply system 1c of the foregoing embodiments, and the power supply system 1, the power supply system 1a, the power supply system 1b, and the power supply system 1c are used to supply power to the load RL.

In summary, the present disclosure provides a power supply system and an electronic device, wherein the output capacitor of the power supply system is surface-mounted on the second side of the system board, and the load is disposed on the first side of the system board, so that the connection path between the output capacitor and the load is very short, that is, the connection path between the output capacitor and the load is only the wiring connected between the output capacitor and the load in the system board, so that the connection impedance between the output capacitor and the load is also low, which improves the power supply performance of the power unit, thereby the overall performance of the power supply system of the present disclosure is also improved. In addition, since each output capacitor is disposed in the corresponding accommodating groove on the substrate, and the output capacitor is located between the corresponding positive output conductive-connected region and the corresponding negative output conductive-connected region, that is, the current on the output capacitor can evenly flow to the positive output terminal and the negative output terminal, so that the uniform current flow effect between the positive output conductive-connected region constituting the positive output terminal and the negative output conductive-connected region constituting the negative output terminal is very significant.

What is claimed is:

1. A power supply system, be used to supply power to a load and comprising:
 a system board comprising a first side and a second side disposed opposite to each other, wherein the load is disposed on the first side;
 a substrate comprising a first side and a second side disposed opposite to each other, the first side of the substrate being located between the second side of the system board and the second side of the substrate;
 at least one output capacitor surface-mounted on the second side of the system board;
 at least one positive output conductive-connected region, disposed on the first side of the substrate, connected to the second side of the system board, and being electrically connected to one terminal of the at least one output capacitor via a wiring in the system board;
 at least one negative output conductive-connected region disposed on the first side of the substrate, connected to the second side of the system board, and being electrically connected to other terminal of the at least one output capacitor via the wiring in the system board; and
 at least one power unit disposed on the second side of the substrate, and being electrically connected to the at least one positive output conductive-connected region and the at least one negative output conductive-connected region via a wiring in the substrate.

2. The power supply system according to claim 1, wherein the at least one power unit comprises at least one positive output terminal and at least one negative output terminal, wherein the at least one positive output terminal is electrically connected to the at least one positive output conductive-connected region via the wiring in the substrate, and the at least one negative output terminal is electrically connected to the at least one negative output conductive-connected region via the wiring in the substrate.

3. The power supply system according to claim 1, wherein the at least one positive output conductive-connected region comprises a plurality of positive output conductive-connected regions, and the at least one negative output conductive-connected region comprises a plurality of negative output conductive-connected regions, and the plurality of positive output conductive-connected regions and the plurality of negative output conductive-connected regions are interleaved with each other; and
 wherein there is a corresponding negative output conductive-connected region between every two of the plurality of positive output conductive-connected regions, and there is a corresponding positive output conductive-connected region between every two of the plurality of negative output conductive-connected regions, wherein each of the output capacitors is disposed between the corresponding positive output conductive-connected region and the corresponding negative output conductive-connected region.

4. The power supply system according to claim 1, wherein the at least one positive output conductive-connected region comprises a plurality of positive output conductive-connected regions, and the at least one negative output conductive-connected region comprises a plurality of negative output conductive-connected regions, and
 wherein there are two corresponding positive output conductive-connected region between every two of the plurality of negative output conductive-connected regions.

5. The power supply system according to claim 1, wherein the at least one positive output conductive-connected region comprises a plurality of positive output conductive-connected regions, and the at least one negative output conductive-connected region comprises a plurality of negative output conductive-connected regions, and
 wherein there are two corresponding negative output conductive-connected region between every two of the plurality of positive output conductive-connected regions.

6. The power supply system according to claim 1, wherein the at least one positive output conductive-connected region comprises a plurality of positive output conductive-connected regions, and the at least one negative output conductive-connected region comprises a plurality of negative output conductive-connected regions, and wherein at least two conductive-connected regions are disposed between two output capacitors adjacent along a first direction, and polarities of the at least two conductive-connected regions are same.

7. The power supply system according to claim 1, wherein the at least one positive output conductive-connected region comprises a plurality of positive output conductive-connected regions, and the at least one negative output conductive-connected region comprises a plurality of negative output conductive-connected regions, and wherein at least three conductive-connected regions are disposed between two output capacitors adjacent along a first direction, and polarities of the conductive-connected regions adjacent to the two output capacitors are different.

8. The power supply system according to claim 1, wherein the at least one positive output conductive-connected region comprises a plurality of positive output conductive-connected regions, and the at least one negative output conductive-connected region comprises a plurality of negative output conductive-connected regions, and wherein there are two output capacitors adjacent along a second direction, and polarities of conductive-connected regions located on a same side of the two output capacitors and adjacent to the two output capacitors are same.

9. The power supply system according to claim 1, wherein the at least one positive output conductive-connected region comprises a plurality of positive output conductive-connected regions, and the at least one negative output conductive-connected region comprises a plurality of negative output conductive-connected regions, and wherein there are two output capacitors adjacent along a second direction, and polarities of conductive-connected regions located on a same side of the two output capacitors and adjacent to the two output capacitors are different.

10. The power supply system according to claim 1, wherein a plurality of pads having a same pad structure as a pad on the first side of the substrate are formed on the second side of the system board;

wherein a plurality of pads having a same pad structure as a pad of the load are formed on the first side of the system board, or a plurality of pads having a same pad structure as a pad of the second side of the system board are formed on the first side of the system board.

11. The power supply system according to claim 1, wherein the first side of the substrate is surface-mounted to the second side of the system board, the substrate further comprises at least one first accommodating groove, the at least one first accommodating groove is formed by concaving the first side of the substrate, wherein each of the first accommodating grooves is disposed between a corresponding positive output conductive-connected region and a corresponding negative output conductive-connected region, and is used to accommodate a corresponding output capacitor, wherein each of the output capacitors is located between the corresponding positive output conductive-connected region and the corresponding negative output conductive-connected region.

12. The power supply system according to claim 11, wherein a volume of each of the first accommodating grooves is greater than a volume of the corresponding output capacitor.

13. The power supply system according to claim 1, wherein the power supply system further comprises two positive input conductive-connected regions and two negative input conductive-connected regions, the two positive input conductive-connected regions are disposed on the first side of the substrate, and is electrically connected to a corresponding power unit via the wiring in the substrate, and the two positive input conductive-connected regions are respectively adjacent to a first sidewall and a second sidewall of the substrate opposite to each other, the at least one positive output conductive-connected region and the at least one negative output conductive-connected region are respectively located between the two positive input conductive-connected regions, wherein the two negative input conductive-connected regions are disposed on the first side of the substrate, and is electrically connected to the corresponding power unit via the wiring in the substrate, the two negative input conductive-connected regions are respectively adjacent to a third sidewall and a fourth sidewall of the substrate opposite to each other, the at least one positive output conductive-connected region and the at least one negative output conductive-connected region are respectively located between the two negative input conductive-connected regions.

14. The power supply system according to claim 13, wherein the first side of the substrate comprises a plurality of second accommodating grooves and a plurality of third accommodating grooves, and the plurality of second accommodating grooves run through the third sidewall and the fourth sidewall of the substrate, a part of the second accommodating grooves are located between the at least one positive output conductive-connected region and a corresponding positive input conductive-connected region, and other part of the second accommodating grooves are located between the at least one negative output conductive-connected region and a corresponding positive input conductive-connected region, wherein the plurality of third accommodating grooves run through the third sidewall and the fourth sidewall of the substrate, a part of the third accommodating groove divide each of the positive output conductive-connected regions into a plurality of sub-positive output conductive-connected regions, and the plurality of sub-positive output conductive-connected regions are sequentially arranged and are spaced apart, and an arrangement direction of the plurality of sub-positive output conductive-connected regions is the same as a direction of the first sidewall of the substrate pointing to the second sidewall, and other part of the third accommodating groove divide each of the negative output conductive-connected regions into a plurality of sub-negative output conductive-connected regions, and the plurality of sub-negative output conductive-connected regions are sequentially arranged and are spaced apart, and an arrangement direction of the plurality of sub-negative output conductive-connected regions is the same as a direction of the first sidewall of the substrate pointing to the second sidewall, and other part of the third accommodating grooves divide each of the negative input conductive-connected regions into a plurality of sub-negative input conductive-connected regions, and the plurality of sub-negative input conductive-connected regions are sequentially arranged and are spaced apart, and an arrangement direction of the plurality of sub-negative input conductive-connected regions is the same as a direction of the first sidewall of the substrate pointing to the second sidewall, wherein the plurality of second accommodating grooves and the plurality of third accommodating grooves are respectively used for accommodating a corresponding output capacitor.

15. The power supply system according to claim 14, wherein the first side of the substrate comprises a plurality of fourth accommodating grooves, and the plurality of fourth accommodating grooves divide each of the positive input conductive-connected regions into a plurality of sub-positive input conductive-connected regions, the plurality of sub-positive input conductive-connected regions are sequentially arranged and are spaced apart, and an arrangement direction of the plurality of sub-positive input conductive-connected regions is the same as a direction of the third sidewall of the substrate pointing to the fourth sidewall, wherein the plurality of fourth accommodating grooves are respectively used for accommodating a corresponding output capacitor.

16. The power supply system according to claim 1, wherein a shape of each of the positive output conductive-connected regions is a circle or a square, and a shape of each of the negative output conductive-connected regions is a circle or a square.

17. The power supply system according to claim 1, wherein the second side of the substrate further comprises a controller pad, a plurality of input capacitor pads and at least one power unit pad, the controller pad is in contact with a controller of the power supply system, so that the controller is electrically coupled to the substrate via the controller pad, and each of the input capacitor pads is in contact with an input capacitor of the power supply system, so that the input capacitor is electrically coupled to the substrate via a corresponding input capacitor pad,
wherein the at least one power unit pad is in contact with the power unit, so that the power unit is electrically coupled to the substrate via a corresponding power unit pad, and each of the power unit pads comprises at least one signal terminal, at least one input terminal, at least one output terminal, and at least one ground terminal, the at least one signal terminal is disposed in one sideline far from a center point of the substrate among the four sidelines of the corresponding power unit pad.

18. The power supply system according to claim 17, wherein the substrate further comprises a plurality of connection holes, each of the connection holes runs through the first side and the second side of the substrate, and a setting position of one terminal of each of the connection holes corresponds to the at least one input terminal, the at least one output terminal or the at least one ground terminal, and a setting position of other terminal of each of the connection holes corresponds to the at least one positive input conductive-connected region, the at least one positive output conductive-connected region, at least one negative input conductive-connected region or at least one negative output conductive-connected region, wherein the at least one input terminal is connected to the at least one positive input conductive-connected region via a corresponding connection hole, the at least one output terminal is connected to the at least one positive output conductive-connected region via a corresponding connection hole, and the at least one ground terminal is connected to the at least one negative input conductive-connected region or the at least one negative output conductive-connected region via a corresponding connection hole.

19. The power supply system according to claim 17, wherein the substrate further comprises a plurality of copper pillars, each of the copper pillars is buried between the first side and the second side of the substrate, a setting position of one terminal of each of the copper pillars corresponds to the at least one input terminal, the at least one output terminal or the at least one ground terminal, and a setting position of other terminal of each of the copper pillars corresponds to the at least one positive input conductive-connected region, the at least one positive output conductive-connected region, at least one negative input conductive-connected region or at least one negative output conductive-connected region,
wherein the at least one input terminal is connected to the at least one positive input conductive-connected region via a corresponding copper pillar, the at least one output terminal is connected to the at least one positive output conductive-connected region via a corresponding copper pillar, and the at least one ground terminal is connected to the at least one negative input conductive-connected region or the at least one negative output conductive-connected region via a corresponding copper pillar.

20. The power supply system according to claim 17, wherein each of the power unit pads comprises a first sidewall, a second sidewall, a third sidewall and a fourth sidewall, wherein the first sidewall and the second sidewall are set opposite to each other, the third sidewall and the fourth sidewall are set opposite to each other and are located between the first sidewall and the second sidewall,
wherein at least one signal terminal comprises a plurality of signal terminals, at least one output terminal comprises a plurality of output terminals, at least one ground terminal comprises a plurality of ground terminals, and the at least one input terminal comprises a plurality of input terminals,
wherein the plurality of signal terminals are adjacent to the first sidewall and are set sequentially, the plurality of output terminals are set at a center position of the power unit pads, the plurality of ground terminals and the plurality of input terminals are sequentially surrounded the plurality of output terminals, and a part of the plurality of input terminals are located between a corresponding signal terminal and a corresponding output terminal.

21. The power supply system according to claim 17, wherein each of the power unit pads comprises a first sidewall, a second sidewall, a third sidewall and a fourth sidewall, wherein the first sidewall and the second sidewall are set opposite to each other, the third sidewall and the fourth sidewall are set opposite to each other and are located between the first sidewall and the second sidewall,
wherein at least one signal terminal comprises a plurality of signal terminals, at least one output terminal comprises a plurality of output terminals, at least one ground terminal comprises a plurality of ground terminals, and the at least one input terminal comprises a plurality of input terminals,
wherein the plurality of signal terminals are adjacent to the first sidewall and set sequentially, the plurality of ground terminals are adjacent to the second sidewall and set sequentially, the plurality of input terminals are set sequentially and located between the plurality of signal terminals and the plurality of output terminals, and the plurality of input terminals are set sequentially and located between the plurality of input terminals and the plurality of ground terminals.

22. The power supply system according to claim 1, wherein the power supply system comprises a plurality of conductive structures, one terminal of each of the conductive structures is connected to the second side of the system board, and other terminal of each of the conductive structures is connected to a corresponding conductive-connected region among the at least one positive input conductive-connected region, the at least one positive output conductive-connected region, the at least one negative input conductive-connected region or the at least one negative output conductive-connected region, wherein an accommodating groove is jointly defined between each of the conductive structures, adjacent another conductive structure, the first side of the substrate, and the second side of the system board, and the accommodating groove is used to accommodate a corresponding output capacitor.

23. The power supply system according to claim 22, wherein each of the conductive structures is formed of a conductive post or a solder ball.

24. The power supply system according to claim 1, wherein the power supply system further comprises a controller, the controller is disposed on the second side of the substrate and is electrically connected to the at least one power unit via the wiring in the substrate, and the controller is used for controlling an operation state of at least one switch element in a corresponding power unit.

25. The power supply system according to claim 1, wherein the power supply system further comprises a plurality of input capacitors, and a part of the input capacitors are disposed on the second side of the substrate;

wherein the at least one power unit comprises a plurality of power units, an arrangement of the plurality of the power units constitutes a plurality of arrangement rows, the plurality of arrangement rows are sequentially arranged, and a number of the power units comprised in each of the plurality of arrangement rows is equal, and the plurality of arrangement rows are spaced apart from the part of the input capacitors disposed on the second side of the substrate.

26. The power supply system according to claim 1, wherein the power supply system further comprises a plurality of input capacitors, each of the power units comprises a switch element and an inductor, wherein the switch element and the inductor are packaged in integrally formed single structure;

wherein, a part of the input capacitors in the power supply system is integrated in the at least one power unit.

27. The power supply system according to claim 1, wherein the load is a processor chip, and the processor chip comprises a CPU, a GPU, a TPU or an NPU.

28. An electronic device, wherein the electronic device comprises a load and a power supply system, wherein the power supply system is used to supply power to the load and comprises:

a system board comprising a first side and a second side disposed opposite to each other, wherein the load is disposed on the first side;

a substrate comprising a first side and a second side disposed opposite to each other, the first side of the substrate being located between the second side of the system board and the second side of the substrate;

at least one output capacitor surface-mounted on the second side of the system board;

at least one positive output conductive-connected region, disposed on the first side of the substrate, connected to the second side of the system board, and being electrically connected to one terminal of the at least one output capacitor via a wiring in the system board;

at least one negative output conductive-connected region disposed on the first side of the substrate, connected to the second side of the system board, and being electrically connected to other terminal of the at least one output capacitor via the wiring in the system board; and at least one power unit disposed on the second side of the substrate, and being electrically connected to the at least one positive output conductive-connected region and the at least one negative output conductive-connected region via a wiring in the substrate.

\* \* \* \* \*